(12) United States Patent
Nebashi et al.

(10) Patent No.: US 7,894,249 B2
(45) Date of Patent: Feb. 22, 2011

(54) MAGNETORESISTIVE ELEMENT AND MAGNETIC RANDOM ACCESS MEMORY

(75) Inventors: Ryusuke Nebashi, Tokyo (JP); Tetsuhiro Suzuki, Tokyo (JP)

(73) Assignee: NEC Corporation, Tokyo (JP)

(*) Notice: Subject to any disclaimer, the term of this patent is extended or adjusted under 35 U.S.C. 154(b) by 57 days.

(21) Appl. No.: 12/224,396

(22) PCT Filed: Feb. 23, 2007

(86) PCT No.: PCT/JP2007/053398
§ 371 (c)(1),
(2), (4) Date: Aug. 26, 2008

(87) PCT Pub. No.: WO2007/099874
PCT Pub. Date: Sep. 7, 2007

(65) Prior Publication Data
US 2009/0135644 A1 May 28, 2009

(30) Foreign Application Priority Data
Feb. 27, 2006 (JP) .............................. 2006-050171

(51) Int. Cl.
*G11C 11/00* (2006.01)
(52) U.S. Cl. .................. 365/158; 365/117; 365/131; 365/145; 365/173; 365/213
(58) Field of Classification Search .............. 365/158, 365/117, 131, 145, 173, 213
See application file for complete search history.

(56) References Cited

U.S. PATENT DOCUMENTS

| | | | |
|---|---|---|---|
| 6,545,906 B1 | 4/2003 | Savtchenko et al. | |
| 6,798,690 B1 | 9/2004 | Katti | |
| 2003/0042903 A1* | 3/2003 | Hasegawa et al. | 324/252 |
| 2006/0083057 A1* | 4/2006 | Nakayama et al. | 365/171 |

FOREIGN PATENT DOCUMENTS

| | | |
|---|---|---|
| JP | 11-273336 | 10/1999 |
| JP | 2003-163330 | 6/2003 |
| JP | 2003-518699 | 6/2003 |
| JP | 2003-332537 | 11/2003 |
| JP | 2005-142299 | 6/2005 |
| JP | 2005-150303 | 6/2005 |

OTHER PUBLICATIONS

PCT/IB/373.
PCT/IB/338.
English-Language Translation of PCT/ISA/237.

* cited by examiner

*Primary Examiner*—Thong Q Le
(74) *Attorney, Agent, or Firm*—McGinn IP Law Group, PLLC

(57) ABSTRACT

A magnetoresistive element includes a free layer a pinned layer; a nonmagnetic layer interposed between the free layer and the pinned layer; and two magnetic layers arranged adjacent to the free layer on an opposite side to the pinned layer. The free layer includes: a first magnetic layer, a second magnetic layer, and a first nonmagnetic layer interposed between the first magnetic layer and the second magnetic layer. Magnetization of the first magnetic layer and magnetization of the second magnetic layer are antiferromagnetically coupled. One of the two magnetic layers is in contact with one end of the free layer in a long-axis direction, and the other of the two magnetic layers is in contact with the other end of the free layer in the long-axis direction.

18 Claims, 14 Drawing Sheets

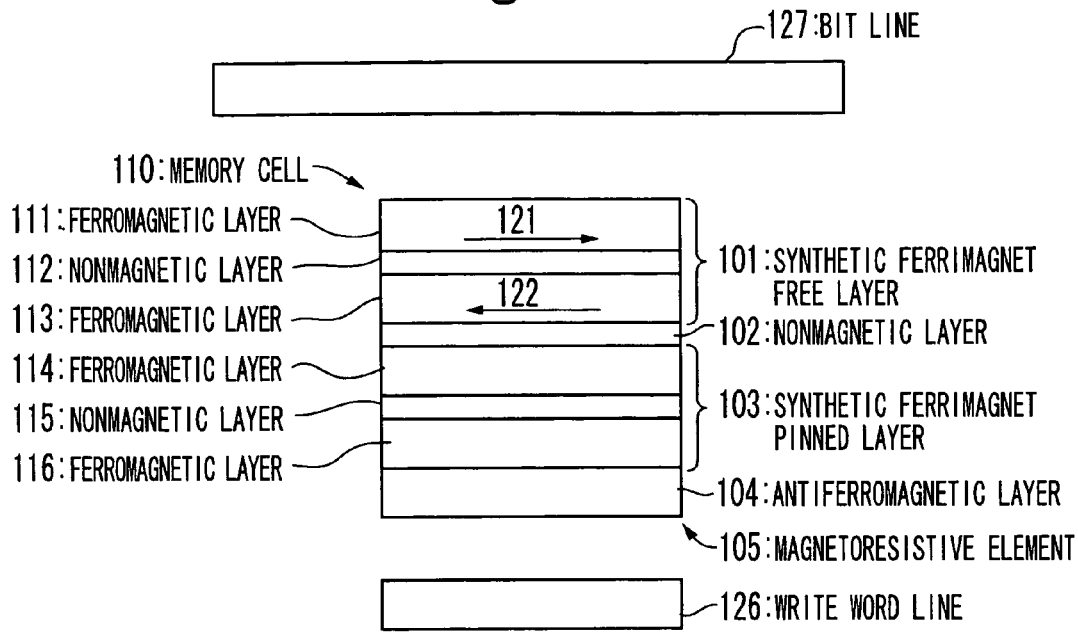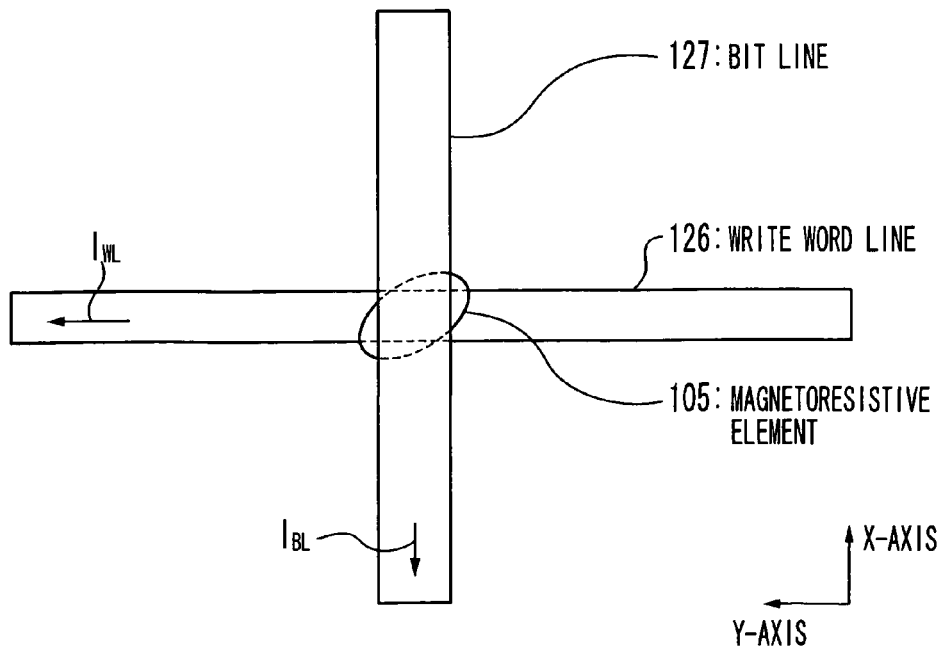

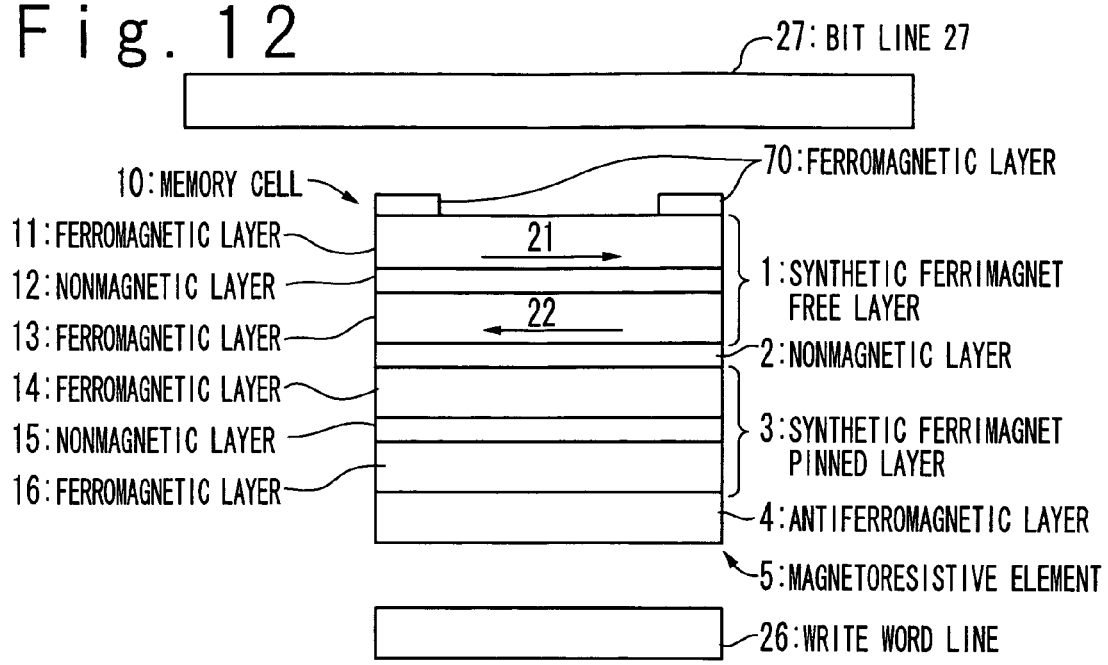
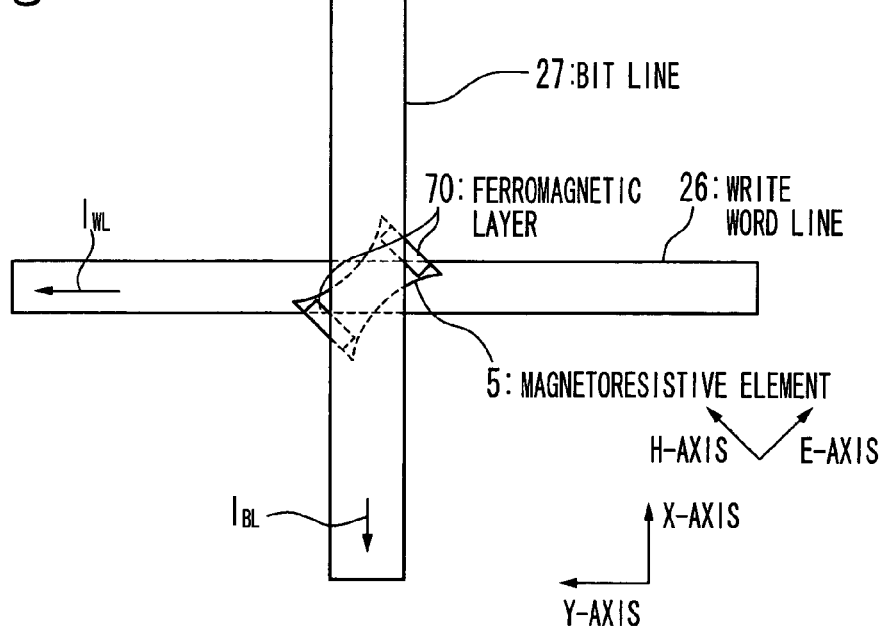
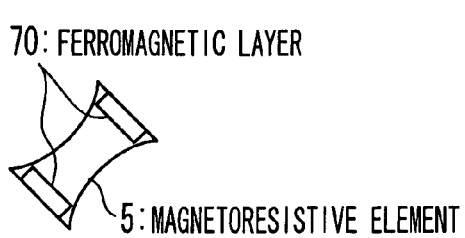

↑ H-AXIS
→ E-AXIS

MAGNETORESISTIVE ELEMENT AND MAGNETIC RANDOM ACCESS MEMORY

TECHNICAL FIELD

The present invention relates to a magnetoresistive element and a magnetic random access memory.

BACKGROUND ART

There is known a magnetic random access memory (referred to as MRAM herein after) which stores data by controlling magnetization directions of storage elements. There are several types of MRAMs corresponding to recording methods of magnetization directions.

U.S. Pat. No. 6,545,906 discloses a toggle-type magnetic random access memory (referred to as a toggle MRAM herein after). In this toggle MRAM, a storage element is a tunnel magnetoresistive element with a synthetic ferrimagnet structure used as a free layer. This MRAM shows excellent selectivity of a memory cell at a time of a write operation. The details of the toggle MRAM will be explained below.

FIG. 1 is a cross-sectional view showing a structure of a conventional toggle MRAM. A magnetoresistive element 105 of a memory cell 110 in this MRAM includes an antiferromagnetic layer 104, a synthetic ferrimagnet pinned layer 103, a nonmagnetic layer (or tunnel insulation layer) 102 and a synthetic ferrimagnet free layer 101. Each of the layers is laminated in this order. The synthetic ferrimagnet pinned layer 103 has a synthetic ferrimagnet structure, including a ferromagnetic layer 116, a nonmagnetic layer 115, and a ferromagnetic layer 114. The synthetic ferrimagnet free layer 101 has a synthetic ferrimagnet structure, including a ferromagnetic layer 113, a nonmagnetic layer 112 and a ferromagnetic layer 111. The memory cell 110 stores data based on a magnetization direction 122 of the ferromagnetic layer 113 and a magnetization direction 121 of the ferromagnetic layer 111. The magnetoresistive element 105 is held between a write word line 126 and a bit line 127 which are crossed from one another in a substantially perpendicular state.

FIG. 2 is a top surface view showing a structure of the conventional toggle MRAM. In this MRAM, the plurality of write word lines 126 and the plurality of bit lines 127 are arranged perpendicularly to each other (though only one of each is shown in FIG. 2), and the magnetoresistive elements 105 are arranged at cross points made by these two lines. The magnetoresistive element 105 is arranged so that an easy magnetization direction (i.e. easy magnetization axis) is pointed at about a direction of 45 degrees (θ) with respect to the word line 126 and the bit line 127. It is in order to realize an easy toggle operation.

Next, a principle of a write operation will be explained in the conventional toggle MRAM. The toggle MRAM is allowed to write only from "1" to "0" and "0" to "1". That is, it is impossible to overwrite "1" to "1" and "0" to "0". Therefore, in a write operation of the conventional toggle MRAM, data is read from a selected memory cell 110 (referred to as a selected cell herein after) in advance. Then, the write operation is not carried out if the read data ("0" or "1") is equal to data to be written ("0" or "1"), or the write operation is carried out by the toggle operation (i.e. toggle writing) if the read data is different from the data to be written.

FIGS. 3A to 3H show a principle of a toggle operation in a conventional toggle MRAM. FIG. 3A is a timing chart of a write current $I_{BL}$ which is made to flow in the bit line 127. FIG. 3B is a timing chart of a write current $I_{WL}$ which is made to flow in the word line 126. FIG. 3C shows a time variation in a magnetization direction 122s of the ferromagnetic layer 113 (shown by thick arrows) and a magnetization direction 121s of the ferromagnetic layer 111 (shown by thin arrows) in a selected cell. FIG. 3D shows a time variation in directions of magnetic fields generated by the write current $I_{BL}$ and the write current $I_{WL}$. FIG. 3E shows time variations in a magnetization direction 122a of the ferromagnetic layer 113 (shown by thick arrows) and a magnetization direction 121a of the ferromagnetic layer 111 (shown by thin arrows) in a non-selected cell which is disposed on the same bit line 127 as the selected cell. FIG. 3F shows a direction of a magnetic field 123 generated by the write current $I_{BL}$. FIG. 3G shows time variations in a magnetization direction 122b of the ferromagnetic layer 113 (shown by thick arrows) and a magnetization direction 121b of the ferromagnetic layer 111 in a non-selected cell which is disposed on the same word line 126 as the selected cell. FIG. 3H shows a direction of a magnetic field 125 generated by the write current $I_{WL}$.

Referring to FIG. 3A, in the toggle operation, the write current $I_{BL}$ is supplied to the bit line 127 at time t2. The write current $I_{WL}$ is supplied to the word line 126 at time t3. The write current $I_{BL}$ is discontinued at time t4. The write current $I_{WL}$ is discontinued at time t5. Owing to the series of the above current controls, magnetic fields such as the magnetic field 123 to a magnetic field 124 to a magnetic field 125 as shown in FIG. 3D are added to a selected cell disposed in a cross point between the selected word line 126, to which the write current $I_{WL}$ is supplied, and the selected bit line 127, to which the write current $I_{BL}$ is supplied. Therefore, the magnetization direction 122s of the ferromagnetic layer 113 and the magnetization direction 121s of the ferromagnetic layer 111 are rotated in the selected cell as shown in FIG. 3C, whereby data can be written. That is, an initial state of "0" is rewritten (or toggled) to a state of "1" or an initial state of "1" is rewritten (or toggled) to a state of "0".

At this time, only a unidirectional magnetic field such as the magnetic field 123 as shown in FIG. 3F is added to a non-selected cell which is disposed on the same bit line 127 as the selected cell. Therefore, as shown in FIG. 3E, the magnetization direction 122a of the ferromagnetic layer 113 and the magnetization direction 121a of the ferromagnetic layer 111 in the non-selected cell exhibit some variations but return to an original state without writing data in the non-selected cell. Similarly, only a unidirectional magnetic field such as the magnetic field 125 as shown in FIG. 3H is added to a non-selected cell which is disposed on the same word line 126 as the selected cell. Therefore, as shown in FIG. 3G, the magnetization direction 122b of the ferromagnetic layer 113 and the magnetization direction 121b of the ferromagnetic layer 111 in the non-selected cell exhibit some variations but return to an original state without writing data in the non-selected cell. Accordingly, toggle writing is capable of preventing multiple writing in which data to be written in the selected cell is also written in the non-selected cell.

An other advantage of toggle writing is that only a unipolar voltage needs to be generated because a direction of a write current is unidirectionally fixed. As a result, smaller transistors can be used as transistors for writing.

However, it is impossible to sort and write "1" and "0" in the conventional toggle MRAM. Therefore, even in a writing cycle, the data needs to be read once to determine whether or not to write data, followed by writing the data. As a result, there is a disadvantage that the writing circle is prolonged due to a period of data reading time and a writing speed is consequently delayed. Since the writing speed is improved if the data reading is omitted in the write circle, there is a demand for a technique to sort and write "1" and "0".

U.S. Pat. No. 6,545,906 discloses a direct writing method as a technique to sort and write "1" and "0". The direct writing method is realized such that a total magnetic moment of two ferromagnetic layers composing a synthetic ferrimagnet free layer is switched in response to an external magnetic field which is equal to or larger than a critical magnetic field. In this method, magnetization is arranged so as to direct the total magnetic moment to the direction to which the magnetic field is applied, whereby "1" and "0" can be written without reading data in advance. This method has a disadvantage in that the multiple writing tends to occur. An other disadvantage of this method is that a bipolar voltage is required to cause write currents to flow to dual directions, which results in requiring a large transistor as a transistor for writing.

Related techniques include Japanese Laid-Open Patent Application JP-A-Heisei 11-273336 (corresponding to U.S. Pat. No. 5,946,228) which discloses an elongated MRAM cell provided with a central nucleus formation for switching. This magnetic device includes a first magnetic region and a magnetic application structure. The first magnetic region can be changed into two magnetic states in response to magnetic stimuli applied thereto. The magnetic application structure is arranged with respect to the first magnetic region in order to apply the magnetic stimuli only to a preferred portion of the first magnetic region. The elongated first magnetic region is formed so as to maintain a common magnetization direction at the respective end portions thereof while having either of the two substantially opposing magnetization directions in the center portion thereof, or the first magnetic region may include a pinned magnetization source at the respective end portions thereof.

U.S. Pat. No. 6,798,690 discloses a magnetoresistive memory. The magnetoresistive memory includes a nonmagnetic layer sandwiched between two magnetic layers. The magnetic layer includes a first bit end having an expanded magnetic volume for supporting magnetization of the first end along a hard magnetization axis, a second bit end having an expanded magnetic volume for supporting magnetization of the second end along the hard magnetization axis, and a body interconnecting the first and second bit ends for supporting body magnetization along an easy magnetization axis. The first and second bit ends may be arranged in an I-shape configuration.

Japanese Translation of PCT No. 2003-518699 (corresponding to WO00/007191) discloses a method of reading/writing an MRAM array. This method of writing and/or reading a magnetic memory array includes the steps of: providing an array of magnetic cells; applying an initialization hard axis magnetic field to the array in a first direction; and selecting a cell in the array for writing. Here, each magnetic cell has an easy magnetization axis, a hard magnetization axis and end domain magnetization, and the array has a first current line that generates an easy axis magnetization field and a second orthogonal current line (12) that generates a hard axis magnetization field when currents are applied thereto. The initialization hard axis magnetization field switches or maintains end domain magnetization field in all cells in a pinned direction. Selecting a cell in the array includes supplying a current to the first current line associated with the selected cell to generate an easy axis magnetization field, simultaneously supplying a current to the second current line associated with the selected cell to generate a hard axis magnetization field, and supplying a current to the second current line which generates a hard axis magnetization field in the first direction.

Japanese Laid-Open Patent Application JP-P 2003-163330 A discloses a magnetic memory. This magnetic memory includes: a first magnetoresistive effect element; a first wiring extended above a first magnetoresistive effect element; a second magnetoresistive effect element arranged above the first wiring; and a second wiring extended in a direction to cross the first wiring above a second magnetoresistive effect element. Each of the first and second magnetoresistive effect elements includes magnetic recording layers with substantially unidirectional magnetization anisotropy. Magnetization of the magnetic recording layer in the second magnetoresistive effect element can be switched owing to a magnetic field created by currents which are made to flow in the first and second wirings, respectively. At least one part of magnetization directions of the magnetic recording layers in the first and second magnetoresistive effect elements are partially inclined to at least any of the first and second wirings.

Japanese Laid-Open Patent Application JP-P 2003-332537 A discloses a magnetic memory element and a magnetic random access memory using the same. This magnetic memory element includes at least two layers of ferromagnetic layers laminated via a nonmagnetic intermediate layer, where information is recorded by changing a magnetization direction of at least one of the ferromagnetic layers between which the nonmagnetic intermediate layer is held, and the state is read by magnetoresistive effects. Then, at least a part of the plane shape of the magnetic memory element includes a cycloid or a cycloidal curve.

DISCLOSURE OF INVENTION

An object of the present invention is to provide a magnetoresistive element and a magnetic random access memory in which "1" and "0" can be sorted and written while preventing multiple writing.

An other object of the present invention is to provide a magnetoresistive element and a magnetic random access memory in which a writing speed in toggle writing can be improved while preventing multiple writing.

This and other objects, features and advantages of the present invention will be readily ascertained by referring to the following description and drawings.

In order to solve the above problems, a magnetoresistive element of the present invention includes: a free layer; a pinned layer; a nonmagnetic layer interposed between the free layer and the pinned layer; and two magnetic layers arranged adjacent to the free layer on an opposite side to the pinned layer. The free layer includes a first magnetic layer, a second magnetic layer and a first nonmagnetic layer interposed between the first magnetic layer and the second magnetic layer. Magnetization of the first magnetic layer and magnetization of the second magnetic layer are antiferromagnetically coupled. One of the two magnetic layers is in contact with one end of the free layer in a long-axis direction, and the other of the two magnetic layers is in contact with the other end of the free layer in the long-axis direction.

In the above magnetoresistive element, a substantially right angle is made between a magnetization direction of a center portion of the free layer and magnetization directions of two magnetic layers.

In the above magnetoresistive element, the two magnetic layers include one of ferromagnetic material and antiferromagnetic material.

In the above magnetoresistive element, the two magnetic layers are included in the free layer.

In the above magnetoresistive element, a magnetovolume of the first magnetic layer is substantially equal to that of the second magnetic layer.

In the above magnetoresistive element, a planar structure of the free layer includes a side along the long axis direction having a portion expanded to a direction different from the long axis direction.

In order to solve the above problems, a magnetic random access memory according to the present invention includes a plurality of first wirings extended in a first direction, a plurality of second wirings extended in a second direction substantially perpendicular to the first direction, and a plurality of memory cells provided at corresponding respective positions where the plurality of the first wirings and the plurality of the second wirings are crossed. Each of the plurality of the memory cells includes any one of the magnetoresistive elements described above. The magnetoresistive element has a long-axis direction different from the first and second directions.

In the above magnetic random access memory, a write operation is executed as follows in a selected cell serving as a memory cell corresponding to a selected first wiring, which is selected from the plurality of the first wirings, and a selected second wiring, which is selected from the plurality of the second wirings. First, a first write current is supplied to a first current wiring which is selected from the selected first wiring and the selected second wiring based on data to be written. Then, a second write current is supplied to a second current wiring which is the remaining one of the selected first wiring and the selected second wiring. Thereafter, the first write current is discontinued. Then, the second write current is discontinued.

In order to solve the above problems, the present invention provides a method of writing a magnetic random access memory. Here, the magnetic random access memory includes: a plurality of first wirings extended in a first direction; a plurality of second wirings extended in a second direction substantially perpendicular to the first direction; and a plurality of memory cells provided at corresponding respective positions where the plurality of the first wirings and the plurality of the second wirings are crossed. Each of the plurality of the memory cells includes a magnetoresistive element. The magnetoresistive element includes: a free layer; a pinned layer; a nonmagnetic layer interposed between the free layer and the pinned layer; and two magnetic layers arranged adjacent to the free layer on an opposite side to the pinned layer. The free layer includes a first magnetic layer, a second magnetic layer and a first nonmagnetic layer which is interposed between the first magnetic layer and the second magnetic layer. Magnetization of the first magnetic layer and magnetization of the second magnetic layer are antiferromagnetically coupled. One of the two magnetic layers is in contact with one end of the free layer in the long axis direction, and the other of the two magnetic layers is in contact with the other end of the free layer in the long-axis direction. The long-axis direction differs from the first and second directions. The method of writing the magnetic random access memory includes: (a) selecting a selected first wiring from the plurality of the first wirings and selecting a selected second wiring from the plurality of the second wirings; (b) supplying a first write current to a first current wiring which is selected from the selected first wiring and the selected second wiring based on data to be written; (c) supplying a second write current to a second current wiring which is the remaining one of the selected first wiring and the selected second wiring, after supplying the first write current; (d) discontinuing the first write current after supplying the second write current; and (e) discontinuing the second write current after discontinuing the first write current.

In the above method of writing the magnetic random access memory, a substantially right angle is made between a magnetization direction of a center portion of the free layer and magnetization directions of the two magnetic layers.

In the above method of writing the magnetic random access memory, the two magnetic layers include one of a ferromagnetic material and an antiferromagnetic material.

In the above method of writing the magnetic random access memory, the two magnetic layers are included in the free layer.

In the above method of writing the magnetic random access memory, a magnetovolume of the first magnetic layer is substantially equal to that of the second magnetic layer.

In the above method of writing the magnetic random access memory, a planar structure of the free layer includes a side along the long axis direction having a portion expanded to a direction different from the long axis direction.

BRIEF DESCRIPTION OF THE DRAWINGS

FIG. 1 is a cross-sectional view showing a structure of a conventional toggle MRAM;

FIG. 2 is a top view showing a structure of the conventional toggle MRAM;

FIG. 12 is a cross-sectional view showing a structure in the vicinity of a memory cell of the MRAM in a second exemplary embodiment according to the present invention;

FIG. 13A is a schematic view showing a structure in the vicinity of the memory cell of the MRAM in the second exemplary embodiment according to the present invention;

FIG. 13B is a schematic view showing a structure in the vicinity of the memory cell of the MRAM in the second exemplary embodiment according to the present invention;

BEST MODE FOR CARRYING OUT THE INVENTION

Exemplary embodiments of a magnetoresistive element and a magnetic random access memory according to the present invention will be explained below with reference to accompanying diagrams.

In a magnetoresistive element, a direction of magnetization at an end portion (herein after, also referred to as end magnetization) influences switching of a magnetization direction as a whole. However, it has been unknown how a toggle operation is influenced by the end magnetization. Through results of experiments, inventors of the present invention found that the toggle operation is executed or not executed depending on an application order of a current to a write wiring in a case where the end magnetization is pinned to a certain direction. The present invention is carried out based on the above findings, disclosing a magnetoresistive element and a magnetic random access memory in which "1" and "0" can be sorted and written by a unipolar current.

First Exemplary Embodiment

Figure 3A:
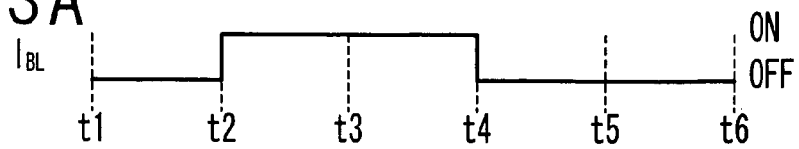
FIG. 3A is a view showing a principle of a toggle operation in the conventional toggle MRAM.
Figure 3B:
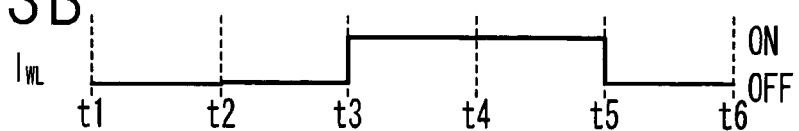
FIG. 3B is a view showing a principle of the toggle operation in the conventional toggle MRAM.
Figure 3C:
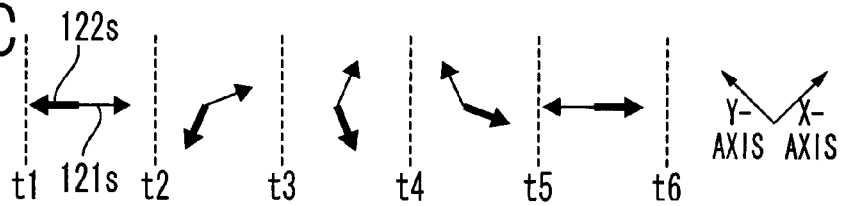
FIG. 3C is a view showing a principle of the toggle operation in the conventional toggle MRAM.
Figure 3D:
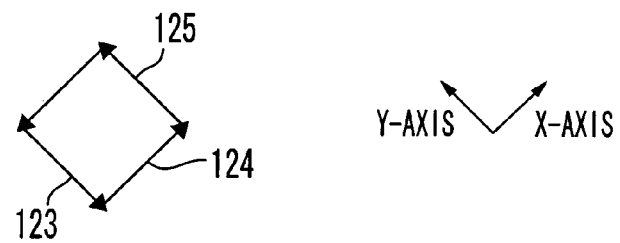
FIG. 3D is a view showing a principle of the toggle operation in the conventional toggle MRAM.
Figure 3E:
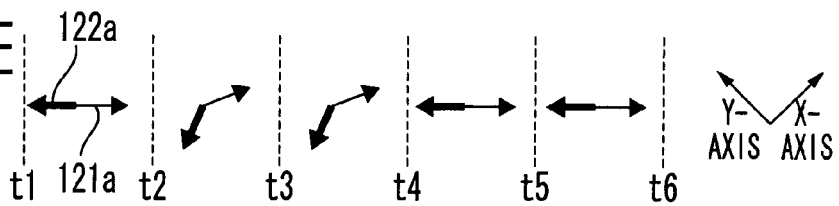
FIG. 3E is a view showing a principle of the toggle operation in the conventional toggle MRAM.
Figure 3F:
FIG. 3F is a view showing a principle of the toggle operation in the conventional toggle MRAM.
Figure 3G:
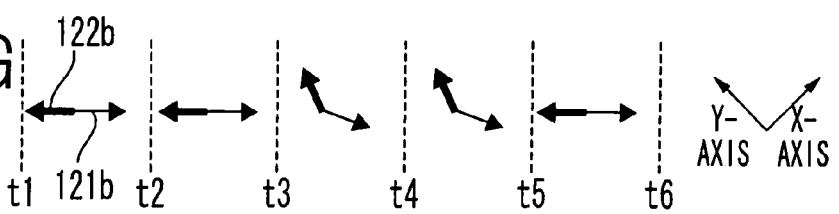
FIG. 3G is a view showing a principle of the toggle operation in the conventional toggle MRAM.
Figure 3H:
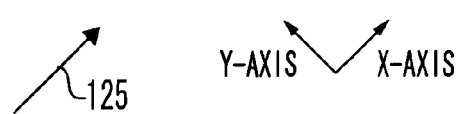
FIG. 3H is a view showing a principle of the toggle operation in the conventional toggle MRAM.
Figure 4:
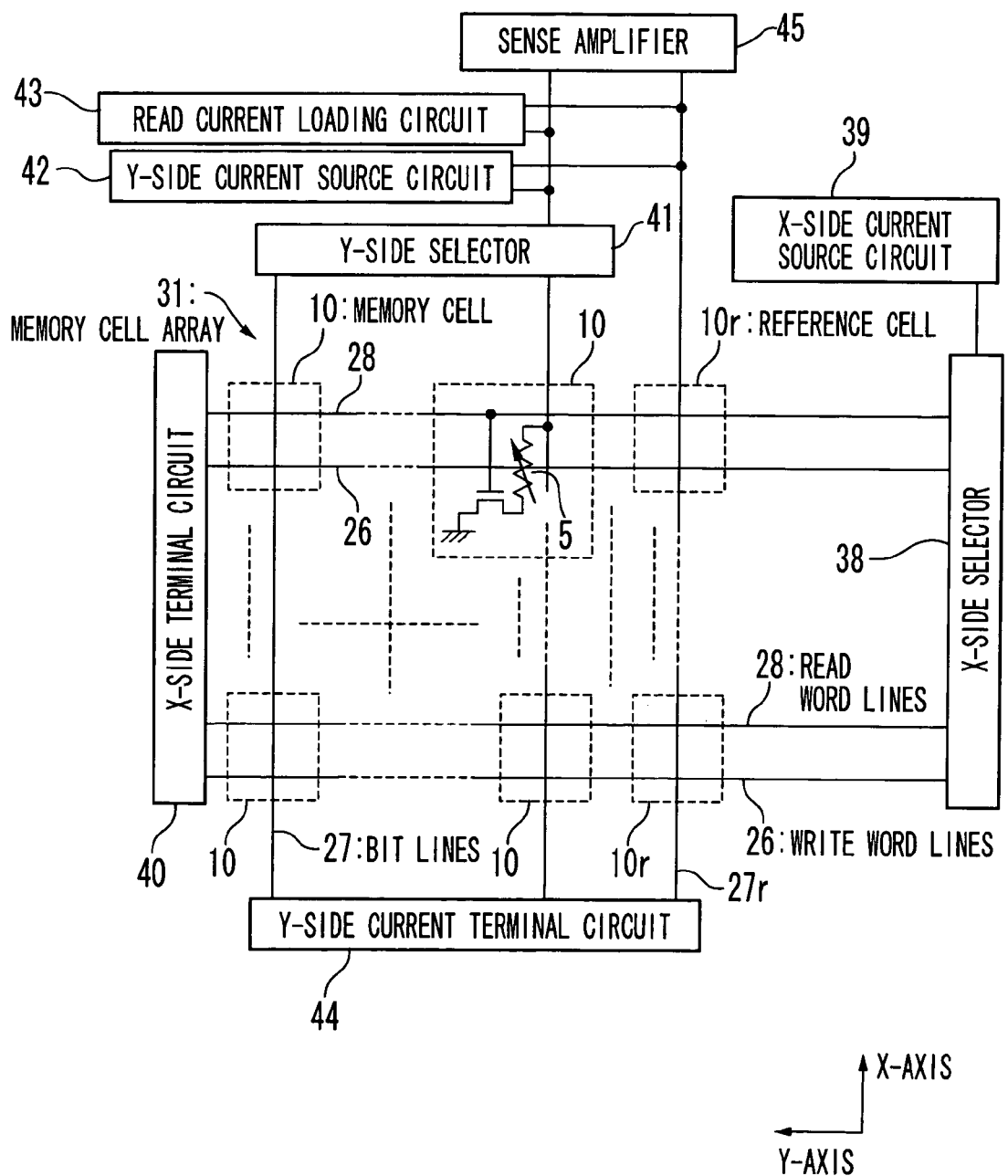
FIG. 4 is a block diagram showing a structure of a magnetic random access memory in exemplary embodiments according to the present invention.

A magnetic random access memory to which a magnetoresistive element is applied in a first exemplary embodiment according to the present invention will be explanation. FIG. 4 is a block diagram showing a structure of the magnetic random access memory (MRAM) in a first exemplary embodiment of the present invention. The MRAM includes a memory cell array 31, a plurality of write word lines 26, a plurality of read word lines 28, a plurality of bit lines 27, an X-side selector 38, an X-side current source circuit 39, an X-side terminal circuit 40, a Y-side selector 41, a Y-side current source circuit 42, a read current loading circuit 43, a Y-side current terminal circuit 44, and a sense amplifier 45.

The memory cell array 31 is provided with a plurality of memory cells 10 arrayed in a matrix form. A plurality of the write word lines 26 and a plurality of the read word lines 28 are extended to a Y-axis direction. One end of each of the plurality of the write word lines 26 and the plurality of the read word lines 28 is connected to the X-side selector 38 and the other end thereof is connected to the X-side terminal circuit 40. Each of the write word lines 26 is paired with each of the read word lines 28 one by one. A plurality of the bit lines 27 is extended to an X-axis direction which is substantially perpendicular to the Y-axis direction. One end of each of the bit lines 27 is connected to the Y-side selector 41 and the other end thereof is connected to the Y-side terminal circuit 44.

The X-side selector 38 selects a desirably selected read word line 28s from the plurality of the read word lines 28 at the time of read operation, and selects a desirably selected write word line 26s from the plurality of the write word lines 26 at the time of write operation. The X-side current source circuit 39 supplies a constant current to the desirably selected write word line 26s at the time of write operation. The X-side terminal circuit 40 terminates the plurality of the write word lines 26.

The Y-side selector 41 selects a desirably selected bit line 27s from the plurality of the bit lines 27. The Y-side current source circuit 42 supplies a constant current to the desirably selected bit line 27s at the time of write operation. The read current loading circuit 43 supplies a predetermined current to a selected memory cell 10 (i.e. selected cell 10s) and a memory cell 10r used as a reference cell (i.e. reference cell) at the time of read operation. The Y-side terminal circuit 44 terminates the plurality of the bit lines 27. The sense amplifier 45 outputs the data of the selected cell 10s based on the difference between a voltage of a bit line 27r for reference which is connected to the reference cell 10r, and a voltage of a bit line 27s which is connected to the selected cell 10s.

Data is read from the memory cell 10 as follows. It should be noted suffix "s" indicates a state of being selected. The selected read word line 28s which is selected by the X-side selector 38 and the selected bit line 27s which is selected by the Y-side selector 44 are used to select the memory cell 10 corresponding to a cross point of these lines as the selected cell 10s. A constant current is supplied from the read current loading circuit 43 to a magnetoresistive element 5 of the selected cell 10s via the selected bit line 27s. The selected bit line 27s is brought into a voltage corresponding to a state of a synthetic ferrimagnet free layer 1 of the magnetoresistive element 5. In contrast, a constant current is also similarly supplied via the bit line 27r to the reference cell 10r which is selected by the selected read word line 28s and the bit line 27r. The bit line 27r is brought into a predetermined reference voltage. The sense amplifier 45 determines data of the selected cell 10s by comparing the size of both voltages. For example, data is determined to be "1" if the voltage of the selected bit line 27s is larger than the reference voltage, or data is determined to be "0" if it is smaller than the reference voltage.

Incidentally, how to write data to the memory cell 10 will be described later.

Figure 5:
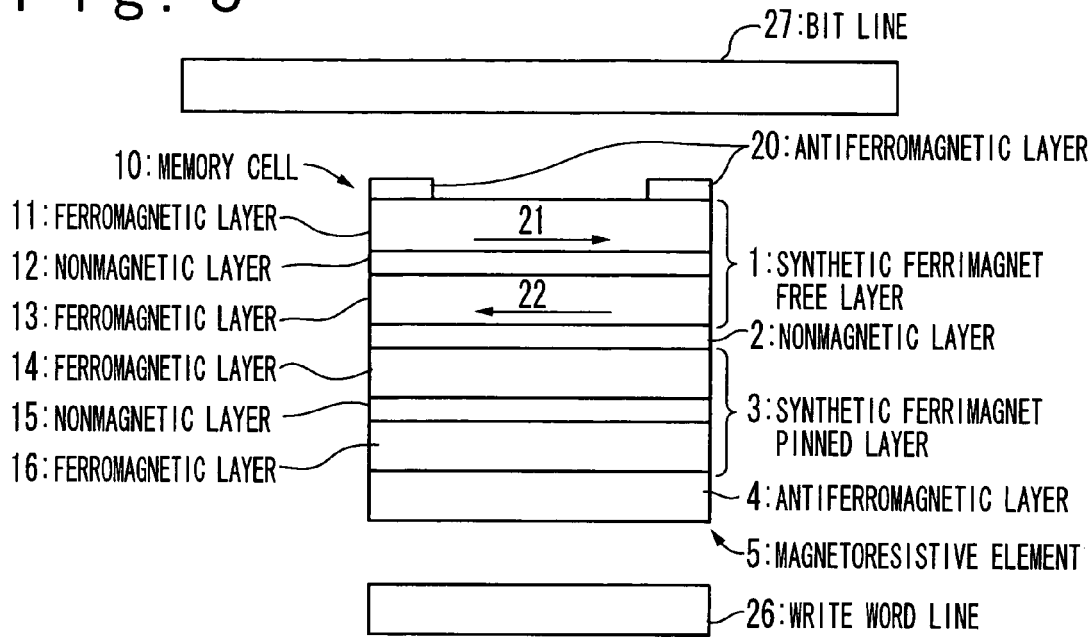
FIG. 5 is a cross-sectional view showing a structure in the vicinity of a memory cell of the MRAM in a first exemplary embodiment according to the present invention.

FIG. 5 is a cross-sectional view showing a structure in the vicinity of the memory cell of the MRAM in the first exemplary embodiment of the present invention. The magnetoresistive element 5 of the memory cell 10 includes an antiferromagnetic layer 4, a synthetic ferrimagnet pinned layer 3, a nonmagnetic layer (or tunnel insulating layer) 2, the synthetic ferrimagnet free layer 1 and antiferromagnetic layers 20, where each of the layers is laminated in this order. The synthetic ferrimagnet pinned layer 3 has a synthetic ferrimagnet structure, where a ferromagnetic layer 16, a nonmagnetic layer 15 and a ferromagnetic layer 14 are laminated in this order. The synthetic ferrimagnet free layer 1 has a synthetic ferrimagnet structure, where a ferromagnetic layer 13, a nonmagnetic layer 12 and a ferromagnetic layer 11 are laminated in this order. The memory cell 10 stores data based on a magnetization direction 22 of the ferromagnetic layer 13 and a magnetization direction 21 of the ferromagnetic layer 11. The magnetoresistive element 5 is provided via an inter layer insulating layer (not shown) between the write word line 26 and the bit line 27 which are crossed from one another in a substantially perpendicular state.

The magnetoresistive element 5 can obtain resistance which is dependent on a relative angle made between magnetization directions of the ferromagnetic layer 13 and the ferromagnetic layer 14 facing each other via the nonmagnetic layer 2, by causing a current to flow at right angle with respect to the plane. The antiferromagnetic layer 4 pins a magnetization direction of the ferromagnetic layer 16 included in the synthetic ferrimagnet pinned layer 3 to a third direction (an E-axis direction serving as a direction of an easy magnetization axis: described later) which is a long-axis direction of the magnetoresistive element 5, whereby the magnetization direction is not switched by a write magnetic field.

The synthetic ferrimagnet pinned layer 3 has a synthetic ferrimagnet structure. The synthetic ferrimagnet structure includes two layers of ferromagnetic materials (i.e. 16 and 14) and the nonmagnetic layer 15 between the first and second layers. The nonmagnetic layer 15 has a film thickness which is determined so that the ferromagnetic layer 16 and the ferromagnetic layer 14 are antiferromagnetically coupled through the nonmagnetic layer 15. The magnetization directions of the ferromagnetic layer 16 and the ferromagnetic layer 14 are pinned to the E-axis direction. The ferromagnetic layer 16 and the ferromagnetic layer 14 are designed so that magnetovolume (which is obtained by multiplying a saturation magnetization and a volume) of the ferromagnetic layer 16 is substantially equal to that of the ferromagnetic layer 14.

The synthetic ferrimagnet free layer 1 has a synthetic ferrimagnet structure. The synthetic ferrimagnet structure includes two layers of ferromagnetic materials (i.e. 13 and 11) and the nonmagnetic layer 12 between the first layer and second layers. The nonmagnetic layer 12 has a film thickness which is determined so that the ferromagnetic layer 13 and the ferromagnetic layer 11 are antiferromagnetically coupled through the nonmagnetic layer 12. The magnetization directions of the ferromagnetic layer 13 and the ferromagnetic layer 11 are pinned to the E-axis direction. The ferromagnetic layer 13 and the ferromagnetic layer 11 are designed so that magnetovolume (which is obtained by multiplying a saturation magnetization and a volume) of the ferromagnetic layer 13 is substantially equal to that of the ferromagnetic layer 11.

The antiferromagnetic layers 20 are provided on both ends of the ferromagnetic layer 11 in the E-axis direction. The antiferromagnetic layer 20 has a magnetization direction pinned to a fourth direction (i.e. an H-axis direction serving as a direction of a hard magnetization axis: described later) which is perpendicular to the E-axis direction. Therefore, magnetization directions of portions in the ferromagnetic layer 11 disposed directly below the antiferromagnetic layers 20 are pinned parallel to the magnetization direction of the antiferromagnetic layers 20.

This magnetoresistive element 5 can be manufactured by a conventionally known method. For example, it can be manufactured by laminating the antiferromagnetic layer 4, the synthetic ferrimagnet pinned layer 3, the nonmagnetic layer 2, the synthetic ferrimagnet free layer 1 and the antiferromagnetic layer 20 in this order, and using appropriate photolithography and etching techniques. The MRAM can also be manufactured by a conventionally known method.

Figure 6A:
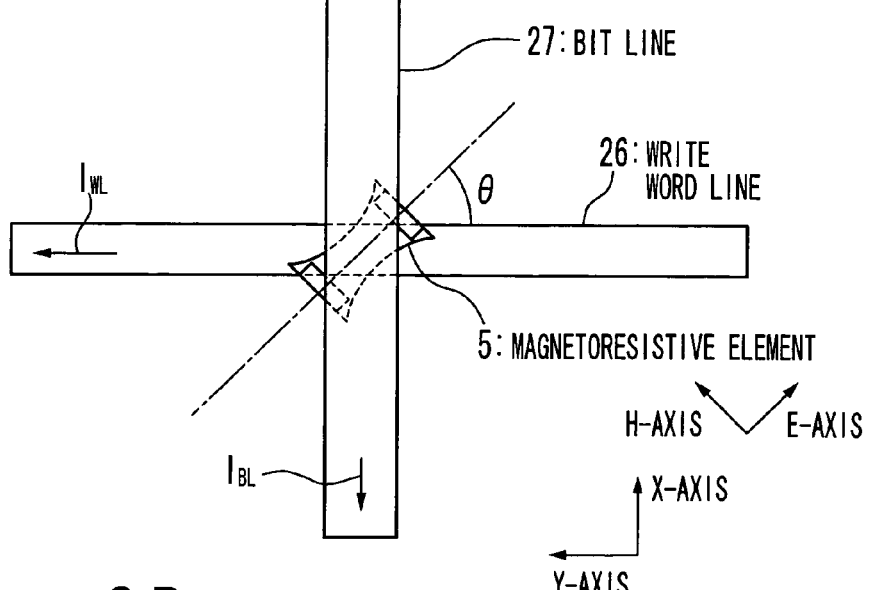
FIG. 6A is a schematic view showing a structure in the vicinity of the memory cell of the MRAM in the first exemplary embodiment according to the present invention.
Figure 6B:
FIG. 6B is a schematic view showing a structure in the vicinity of the memory cell of the MRAM in the first exemplary embodiment according to the present invention.

FIGS. 6A and 6B are schematic views showing structures in the vicinity of the memory cell of the MRAM in the first exemplary embodiment of the present invention. FIG. 6A shows a top view in the vicinity of the memory cell, and FIG. 6B shows a top view of the magnetoresistive element of the memory cell. The magnetoresistive element 5 is disposed to a direction in which a longitudinal direction (or long-axis direction) thereof oriented to the E-axis direction is tilted at about 45 degrees (θ) with respect to the write word line 26 and the bit line 27. It is because the toggle operation is considered to be easily executed. The magnetoresistive element 5 has a long axis oriented to the E axis, and ends of sides along this long axis have a shape expanded to a fourth direction (or the H-axis direction perpendicular to the E-axis direction). The antiferromagnetic layer 20 is formed so as to be in contact with only the expanded end regions of the synthetic ferrimagnet free layer 1 of the magnetoresistive element 5.

FIGS. 7A to 7H show types of stable states which can be taken by magnetization of the synthetic ferrimagnet free layer 1. Each of arrows indicates a medium direction of magnetization in each of regions. In each of FIGS. 7A to 7H, an arrow with a wide width indicates magnetization direction (i.e. 21, 61) in the ferromagnetic layer 11 of the first layer, and an arrow with a narrow width indicates magnetization direction (i.e. 22, 62) in the ferromagnetic layer 13 of the second layer, respectively. In either case, magnetization in the vicinity of the center portion are oriented along the E-axis direction (i.e. the third direction) which is the long axis direction. In contrast, magnetization in the vicinity of the each end portion is oriented along the H-axis direction (i.e. the fourth direction) so as to reduce local magnetostatic energy, owing to the expanded end portions. Moreover, since the ferromagnetic layer 11 and the ferromagnetic layer 13 are antiferromagnetically coupled via the nonmagnetic layer, the magnetization of the ferromagnetic layer 11 are locally antiparallel to the magnetization of the ferromagnetic layer 13. Accordingly, there are eight types of stable states in the single synthetic ferrimagnet free layer 1 as shown in FIGS. 7A to 7H.

Figure 7A:
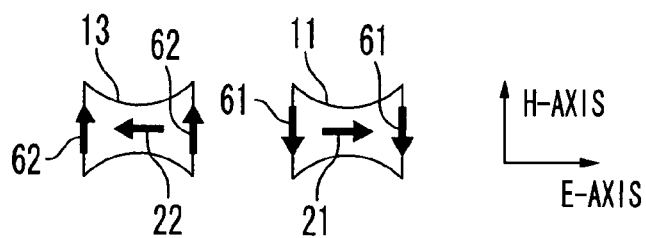
FIG. 7A is a view showing types of stable states which can be taken by magnetization of a synthetic ferrimagnet free layer.
Figure 7B:
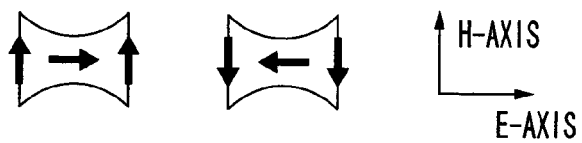
FIG. 7B is a view showing types of stable states which can be taken by the magnetization of the synthetic ferrimagnet free layer.
Figure 7C:
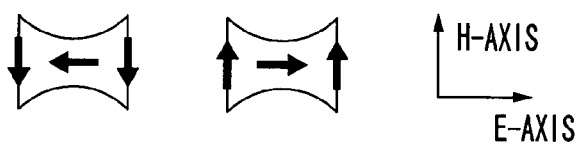
FIG. 7C is a view showing types of stable states which can be taken by the magnetization of the synthetic ferrimagnet free layer.
Figure 7D:
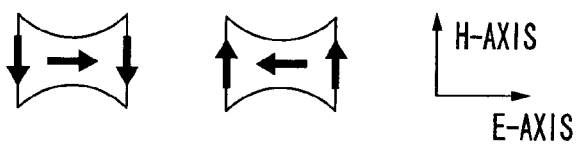
FIG. 7D is a view showing types of stable states which can be taken by the magnetization of the synthetic ferrimagnet free layer.
Figure 7E:
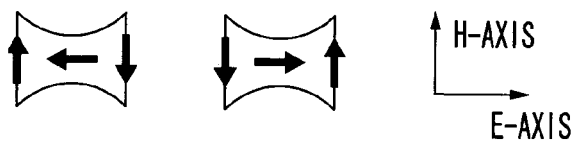
FIG. 7E is a view showing types of stable states which can be taken by the magnetization of the synthetic ferrimagnet free layer.
Figure 7F:
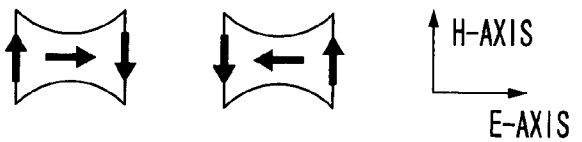
FIG. 7F is a view showing types of stable states which can be taken by the magnetization of the synthetic ferrimagnet free layer.
Figure 7G:
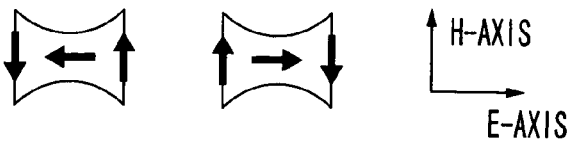
FIG. 7G is a view showing types of stable states which can be taken by the magnetization of the synthetic ferrimagnet free layer.
Figure 7H:
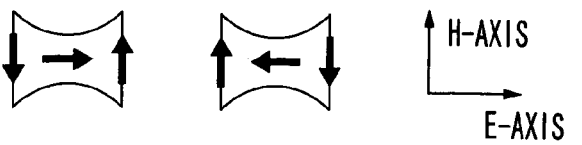
FIG. 7H is a view showing types of stable states which can be taken by the magnetization of the synthetic ferrimagnet free layer.

In the magnetoresistive element 5 of the present exemplary embodiment, eight types of stable states can be narrowed down to two types by causing the antiferromagnetic layers 20 to be in contact with the synthetic ferrimagnet free layer 1. Since the antiferromagnetic layers 20 are laminated on end regions of the ferromagnetic layer 11 of the synthetic ferrimagnet free layer 1, magnetization of each of the end regions to be in contact with the antiferromagnetic layer can be set to a desired direction in the H-axis direction. Magnetization directions of the end regions can be set so as not to be switched by using an appropriate write magnetic field. As a result, a stable state is realized such that the magnetization directions in the end regions of the ferromagnetic layer 11 are constantly oriented to desired directions (i.e. 61, 62) in the H-axis direction, and the magnetization direction in the vicinity of the center portion thereof is oriented to one of +E direction and −E direction (i.e. 21, 22) in the E-axis direction. If the magnetization direction of the antiferromagnetic layer 20 is assumed to be a −H direction for example, the magnetization direction of the synthetic ferrimagnet free layer 1 is in one of the two types of the stable states as shown in FIGS. 7A and 7B. Therefore, "0" and "1" can be distinguished by the magnetization directions (i.e. 21, 22) in the vicinity of the center portion.

The magnetization directions of the end portions are pinned by magnetostatic energy and exchange energy with the antiferromagnetic layer. When the stable end magnetization directions are not switched at the time of writing, in the toggle operation, energy is split when the magnetization direction in the vicinity of the center portion parallel to the magnetization directions of the end portions is rotated and when the magnetization direction in the vicinity of the center portion antiparallel to the magnetization directions of the end portions is rotated. It is caused by the exchange energy within a plane between the end magnetization and the magnetization in the vicinity of the center portion. Energy is low when the end magnetization and the magnetization in the vicinity of the center portion are parallel rather than when they are antiparallel. This property is used to sort and write "1" and "0". The details will be explained below.

Figure 8A:
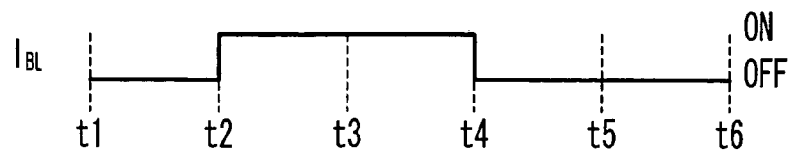
FIG. 8A is a view showing an operation principle in the MRAM of the present invention.
Figure 8B:
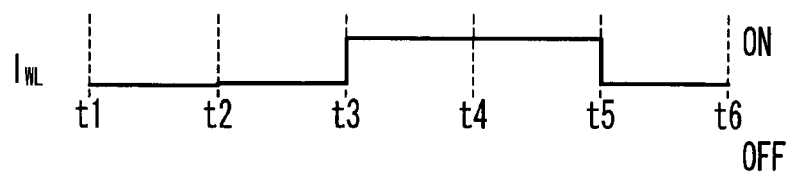
FIG. 8B is a view showing an operation principle in the MRAM of the present invention.
Figure 8C:
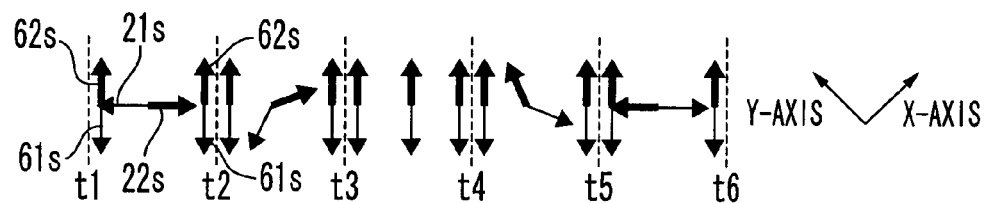
FIG. 8C is a view showing an operation principle in the MRAM of the present invention.
Figure 8D:
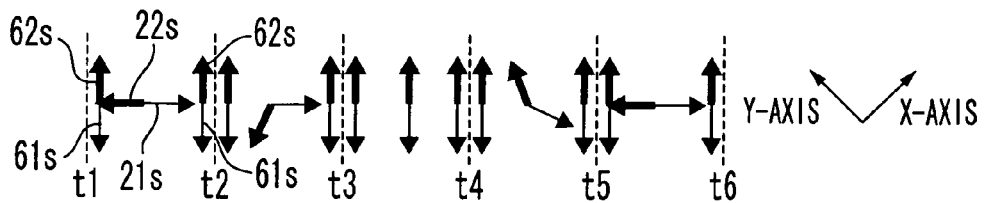
FIG. 8D is a view showing an operation principle in the MRAM of the present invention.
Figure 8E:
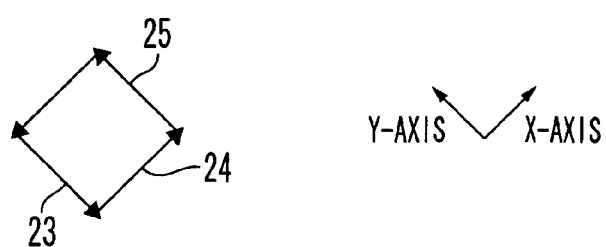
FIG. 8E is a view showing an operation principle in the MRAM of the present invention.

FIGS. 8A to 8E show an operation principle in the MRAM which is capable of sorting and writing "1" and "0" according to the present invention. FIG. 8A is a timing chart of a write current $I_{BL}$ which is made to flow in the bit line 27. FIG. 8B is a timing chart of a write current $I_{WL}$ which is made to flow in the write word line 26. FIG. 8C shows time variations in magnetization directions 21s and 61s (thin arrows) of the ferromagnetic layer 11 and magnetization directions 22s and 62s (thick arrows) of the ferromagnetic layer 13 in the selected cell 10s serving as the memory cell 10 to write data. FIG. 8D shows time variations in the magnetization directions 21s and 61s (thin arrows) of the ferromagnetic layer 11 and the magnetization directions 22s and 62s (thick arrows) of the ferromagnetic layer 13 in the selected cell 10s. FIGS. 8C and 8D are different in an initial state. FIG. 8E shows time variations in directions of magnetic fields which are generated by the write current $I_{BL}$ and the write current $I_{WL}$.

FIG. 8C is a model diagram showing the results of simulation using a Landau-Lifshitz-Gilbert equation (referred to as LLG simulation herein after) in the case of applying a magnetic field counterclockwise to the synthetic ferrimagnet free layer 1 of the present invention. The magnetoresistive element is assumed to have a synthetic ferrimagnet structure including the ferromagnetic layer 11, the nonmagnetic layer 12 and the ferromagnetic layer 13 in this calculation. End magnetization directions are not pinned by the nonmagnetic layer 20. A size of a magnetic field at the end portions are set so that it is equal to or larger than a flop magnetic field when the magnetic field is oriented to the easy axis. The initial state is provided by setting the magnetization direction 21s in the center portion of the ferromagnetic layer 11 leftward, and setting the magnetization direction 22s in the center portion of the ferromagnetic layer 13 rightward. In this magnetoresistive element, a state of memory is determined by the magnetization directions in the vicinity of the center portion. Here, a magnetization state obtained when the magnetization direction 21s in the vicinity of the center portion of the ferromagnetic layer 11 is leftward is defined to be "1". The end magnetization directions 61s of the ferromagnetic layer 11 are downward and the end magnetization directions 62s of the ferromagnetic layer 13 are upward. One end magnetization direction is parallel to the other end magnetization direction within the same layer. When the toggle writing is carried out in this initial state of "1", the magnetization directions (i.e. 21s, 22s) in the vicinity of the center portion rotate counterclockwise in synchronization with a magnetic field applied counterclockwise. Therefore, the magnetization directions (i.e. 21s, 22s) in the vicinity of the center portion are switched such that "0" is written in the magnetoresistive element 5. Moreover, end magnetization directions (i.e. 61s, 62s) remain the same before and after the toggle operation.

FIG. 8D differs from FIG. 8C in the initial state. The initial state is provided by setting the magnetization direction 21s in the center portion of the ferromagnetic layer 11 rightward and setting the magnetization direction 22s in the center portion of the ferromagnetic layer 13 leftward. That is, the initial state is a state of "0". The end magnetization directions in FIG. 8D are similar to those in FIG. 8C. When the toggle writing is carried out in the initial state of "0", the magnetization directions (i.e. 21s, 22s) in the vicinity of the center portion are unable to rotate counterclockwise because the magnetization in the vicinity of the center portion (21s, 22s) tries to be parallel to each other for the necessity of reducing exchange coupling energy with the end magnetization (61s, 62s). As a result, the state of the magnetoresistive element 5 remains "0" after the writing operation is completed.

As shown in FIGS. 8C and 8D, "0" can be written to the magnetoresistive element 5 having the present end magnetization directions 61 and 62 when the magnetic field is applied counterclockwise.

Figure 9A:
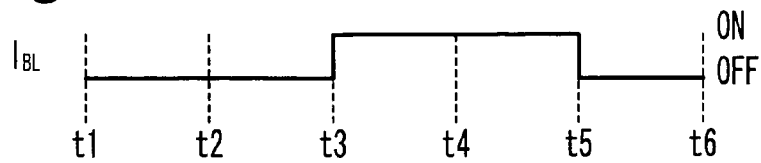
FIG. 9A is a view showing an operation principle in the MRAM of the present invention.
Figure 9B:
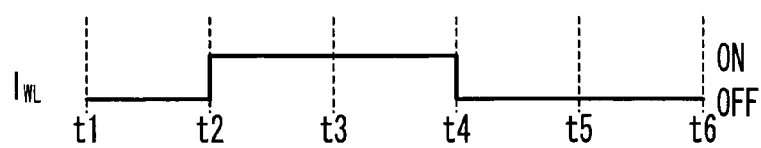
FIG. 9B is a view showing an operation principle in the MRAM of the present invention.
Figure 9C:
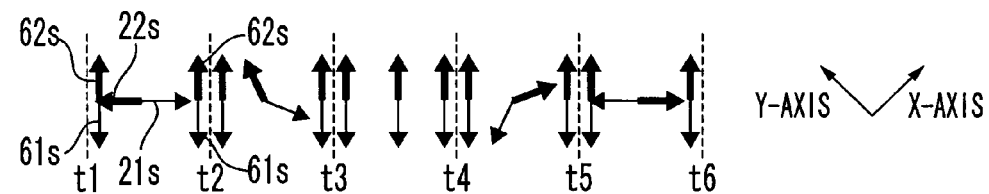
FIG. 9C is a view showing an operation principle in the MRAM of the present invention.
Figure 9D:
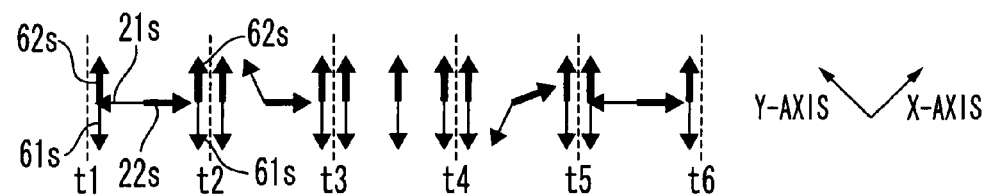
FIG. 9D is a view showing an operation principle in the MRAM of the present invention.
Figure 9E:
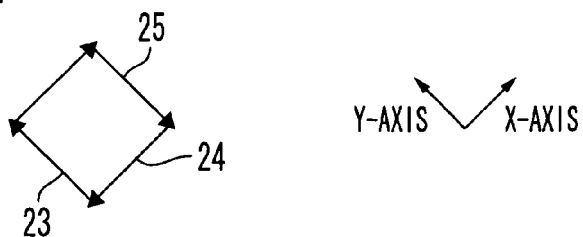
FIG. 9E is a view showing an operation principle in the MRAM of the present invention.

FIGS. 9A to 9E show an operation principle of the MRAM which is capable of sorting and writing "1" and "0" according to the present invention. FIG. 9A is a timing chart of the current $I_{BL}$ which is made to flow in the bit line 27. FIG. 9B is a timing chart of the write current $I_{WL}$ which is made to flow in the write word line 26. FIG. 9C shows time variations in the magnetization directions 21s and 61s (shown by thin arrows) of the ferromagnetic layer 11 and the magnetization directions 22s and 62s (shown by thick arrows) of the ferromagnetic layer 13 in the selected cell 10s. FIG. 9D shows time variations in the magnetization directions 21s and 61s (shown by thin arrows) of the ferromagnetic layer 11 and the magnetization directions 22s and 62s (shown by thick arrows) of the ferromagnetic layer 13 in the selected cell 10s. FIG. 9C and FIG. 9D are different in the initial state. FIG. 9E shows time variations in directions of magnetic fields which are generated by the write current $I_{BL}$ and the write current $I_{WL}$.

FIG. 9C is a model diagram showing the results of the LLG simulation in which a magnetic field is applied clockwise to the synthetic ferrimagnet free layer 1 of the present invention. The initial state is a state of "0". End magnetization directions in FIG. 9C are similar to those in FIG. 8C. When the toggle writing is carried out in the initial state of "0", the magnetization directions (i.e. 21s, 22s) in the vicinity of the center portion rotate clockwise in synchronization with a magnetic field which is applied clockwise. Therefore, the magnetization directions (i.e. 21s, 22s) in the vicinity of the center portion rotate such that "1" is written in the magnetoresistive element 5. Moreover, the end magnetization directions (61s, 62s) remain the same before and after the toggle operation.

FIG. 9D differs from FIG. 9C in the initial state. The initial state is a state of "1". End magnetization directions are similar to those in FIG. 8C. When toggle writing is carried out in the initial state of "1", the magnetization directions (i.e. 21s, 22s) in the vicinity of the center portion are unable to rotate clockwise because the magnetization (21s, 22s) in the vicinity of the center portion tries to be parallel to each other for the necessity of reducing exchange coupling energy with the end magnetization (61s, 62s). As a result, the state of the magnetoresistive element 5 remains "1" after the writing operation is completed.

As shown in FIGS. 9C and 9D, "1" can be written to the magnetoresistive element 5 having the present end magnetization directions 61s and 62s when a magnetic filed is applied clockwise.

Figure 10A:
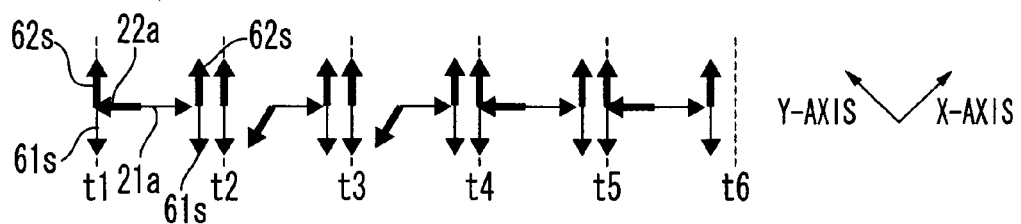
FIG. 10A is a view showing time variations in magnetization directions of a non-selected cell of the MRAM according to the present invention.
Figure 10B:
FIG. 10B is a view showing time variations in magnetization directions of the non-selected cell of the MRAM according to the present invention.
Figure 10C:
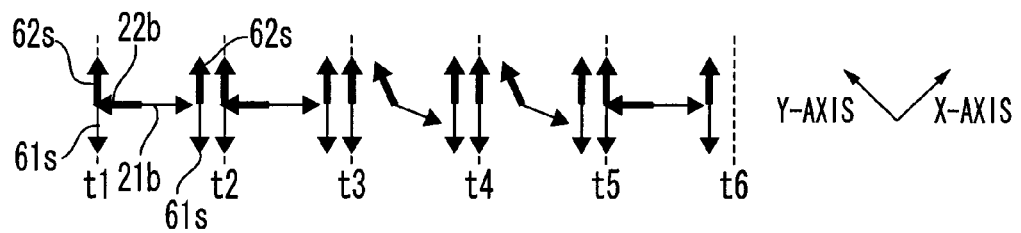
FIG. 10C is a view showing time variations in magnetization directions of the non-selected cell of the MRAM according to the present invention.
Figure 10D:
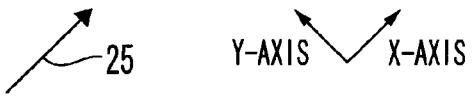
FIG. 10D is a view showing time variations in magnetization directions of the non-selected cell of the MRAM according to the present invention.

FIGS. 10A to 10D show time variations in magnetization directions of a non-selected cell in the MRAM of the present invention. FIG. 10A shows time variations in the magnetization direction 21a of the ferromagnetic layer 11 and the magnetization direction 22a of the ferromagnetic layer 13 in a non-selected cell which is arranged on the same bit line 27 as the selected cell 10s. FIG. 10B shows time variations in the direction of a magnetic field generated by the write current $I_{BL}$. FIG. 10C shows time variations in the magnetization direction 21b of the ferromagnetic layer 11 and the magnetization direction 22b of the ferromagnetic layer 13 in a non-selected cell which is arranged on the same write word line 26 as the selected cell 10s. FIG. 10D shows time variations in the direction of a magnetic field which is generated by the write current $I_{WL}$.

At the time of the toggle writing operation, only a unidirectional magnetic field such as the magnetic field 23 as shown in FIG. 10B is applied to the non-selected cell 10 which is arranged on the same bit line 27 as the selected cell 10s. Therefore, the magnetization direction 21a of the ferromagnetic layer 11 and the magnetization direction 22a of the ferromagnetic layer 13 exhibit some variations but return to the original state in the non-selected cell 10 as shown in FIG. 10A, whereby data is not written. Similarly, only a unidirectional magnetic field such as the magnetic field 25 as shown in FIG. 10D is applied to the non-selected cell 10 arranged on the same write word line 26 as the selected cell 10s. Therefore, as shown in FIG. 10C, the magnetization direction 21b of the ferromagnetic layer 11 and the magnetization direction 22b of the ferromagnetic layer 13 exhibit some variations but return to the original state in the non-selected cell 10, whereby data is not written. Accordingly, it is made possible to prevent multiple writing where data is also written to the non-selected cell 10 when data is written to the selected cell 10s.

As stated above, when the end magnetization directions 61s and 62s as shown in FIGS. 8A to 8E and FIGS. 9A to 9E are employed, the write current $I_{BL}$ is made to flow first in the bit line 27 in the case of writing "0" and the write current $I_{WL}$ is made to flow first in the write word line 26 in the case of writing "1". Using such operation, it is unnecessary to execute the pre-reading operation carried out in the conventional toggle MRAM to determine whether or not to write data. It is therefore made possible to improve a writing speed.

In order to magnetically pin the end magnetization directions to the +H direction in the ferromagnetic layer 11 of the synthetic ferrimagnet free layer 1, it is possible to use lamination formed with the antiferromagnetic layer 20. However, if the magnetization direction of the synthetic ferrimagnet free layer 3 are additionally pinned magnetically to the E-axis directions using the antiferromagnetic layer 4, it is necessary to select materials with different Neel temperatures and to magnetically pin layers stepwise from the antiferromagnetic layer whose blocking temperature is high.

Figure 11:
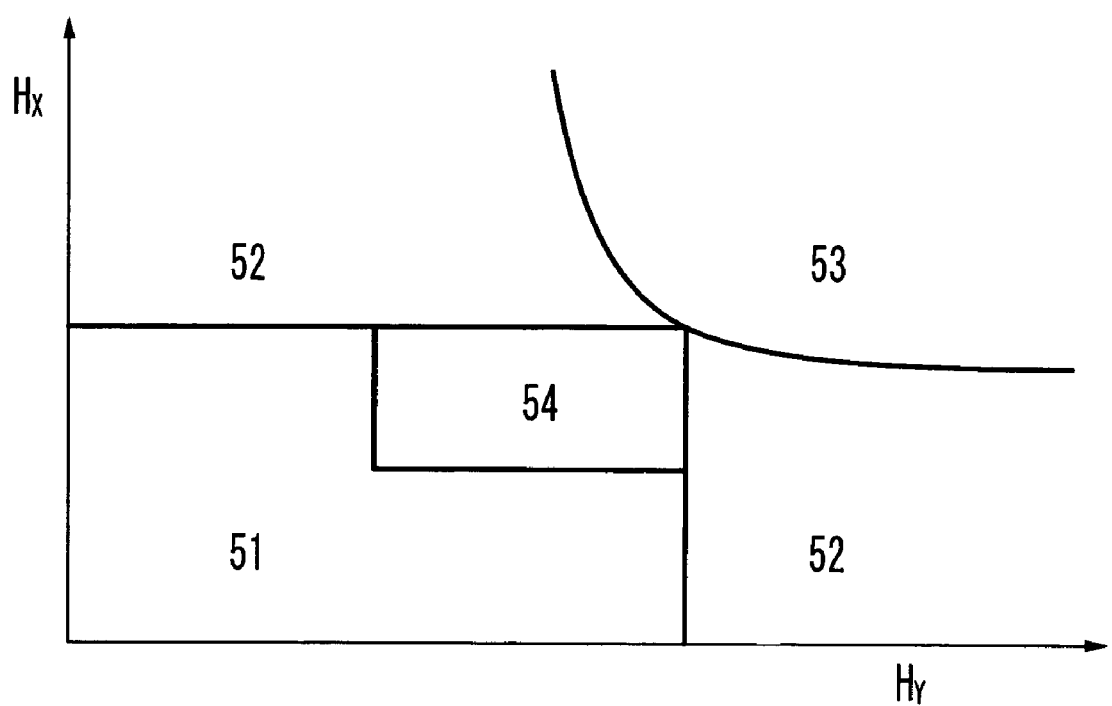
FIG. 11 is a graph showing a region of a magnetic field in which "1" and "0" can be sorted and written in the MRAM of the present invention.

FIG. 11 is a graph showing a region of a magnetic field in which "1" and "0" can be sorted and written in the MRAM of the present invention. It should be noted that effects of pinning the end magnetization directions by the antiferromagnetic layer 20 are not considered in the initial state where the end magnetization directions 61 and 62 are parallel in the synthetic ferrimagnet free layer 1. The ferromagnetic layer 11 and the ferromagnetic layer 13 in the synthetic ferrimagnet free layer 1 are also assumed to have an equivalent magnetovolume. Even if the toggle writing is carried out in a magnetic field region 51, magnetization directions of the synthetic ferrimagnet free layer 1 do not change before and after application of the magnetic field. In magnetic field regions 52 and 53, the end magnetizations can be switched. Normal toggle writing is operated in the magnetic field region 53. In a magnetic field region 54, "1" and "0" can be sorted and written.

In order to increase an upper limit of the region in which "1" and "0" can be sorted and written, switching of the end magnetization directions 61 and 62 should be prevented. Even if the toggle writing is carried out in the magnetic field region 51, the magnetization direction of the synthetic ferrimagnet free layer 1 does not change before and after application of a magnetic field. Although FIG. 11 shows a result obtained when the end magnetization directions are stabilized only by magnetostatic coupling, laminated formation of the antiferromagnetic layer 20 makes it possible to further stabilize the end magnetization directions 61 and 62. Accordingly, further expansion of a region in which "1" and "0" can be sorted and written can be expected.

Data is written to the memory cell 10 as follows. It should be noted the entire memory cells 10 are unified so that the first ferromagnetic layer 11 of the synthetic ferrimagnet free layer 1 of each memory cell 10 has the end magnetization directions 61 oriented to one of the +H direction and the −H direction. Incidentally, the suffix "s" indicates a state of being selected.

The memory cell 10 corresponding to a cross point between the selected write word line 26s, which was selected by the X-side selector 38, and the selected bit line 27s, which was selected by the Y-side selector 41, is used as the selected cell 10s. In order to write data to the magnetoresistive element 5 of the selected cell 10s, the Y-side current source circuit 42 supplies the write current $I_{BL}$ to the selected bit line 27s, and the X-side current source circuit 40 supplies the write current $I_{WL}$ to the selected write word line 26s. At this time, one of the write current $I_{BL}$ and the write current $I_{WL}$ is made to flow first based on the data (i.e. one of "1" and "0") to be written, and the other current is made to flow after a delay of a predetermined period of time. The current which is made to flow first is then discontinued, followed by discontinuing the current which is made to flow later. The details are as shown in FIGS. 8A to 8E and FIGS. 9A to 9E. Therefore, the magnetization direction 21s of the synthetic ferrimagnet free layer 1 of the magnetoresistive element 5 is maintained or made to rotate so as to correspond to the data (i.e. one of "1" and "0") to be written, whereby the data is written.

As stated above, the magnetization directions (i.e. 21, 22) in the vicinity of the center portion of the synthetic ferrimagnet free layer 1 are oriented to the long-axis direction (i.e. E-axis direction) in the magnetoresistive element 5 of the present invention, where the direction determines the data of "1" and "0". Since the end portions of the magnetoresistive element 5 are expanded, the end magnetization directions (i.e. 61, 62) are oriented along a direction (i.e. H-axis direction) which is substantially perpendicular to the long-axis direction so as to reduce local magnetostatic energy. Moreover, the ferromagnetic layers 11 and 13 arranged on the upside and downside of nonmagnetic layer 12 are antiferromagnetically coupled, which means the magnetization directions of the upper and lower ferromagnetic layers 11 and 13 are locally antiparallel. Furthermore, if the antiferromagnetic layers 20 are laminated on the end portions of the ferromagnetic layer 11, the end magnetization directions of the synthetic ferrimagnet free layer 1 can be set and pinned to the H-axis direction. The end magnetization directions 61 and 62 influence switching of the magnetization direction (i.e. 21, 22) in the vicinity of the center portion through exchange coupling at the time of the write operation. Depending on a combination of the rotational direction of the magnetic field and the end magnetization directions (i.e. 61, 62), there are cases where the toggle operation can be performed by the combination assisting the switching and where the toggle operation cannot be performed by the combination preventing the switching. As a result, "1" and "0" can be sorted and written in the order of current application.

The present invention makes it possible to obtain a magnetoresistive element and a magnetic random access memory in which "1" and "0" can be sorted and written while preventing multiple writing. Owing to sorting and writing "1" and "0", it is unnecessary to read data at the time of write operation as required in the conventional toggle MRAM, whereby a writing speed can be improved.

Second Exemplary Embodiment

The magnetic random access memory to which the magnetoresistive element is applied in a second exemplary embodiment according to the present invention will be explained. Since a structure of the MRAM in the second exemplary embodiment of the present invention is similar to that in the first exemplary embodiment (as show in FIG. 4), explanation of the structure will be omitted.

The first exemplary embodiment provides the toggle MRAM which is capable of sorting and writing "1" and "0" by using the ferromagnetic layers, and variously modification can be made to a structure thereof. A basic concept of following exemplary embodiments will be explained here. As explained above, the magnetoresistive element which is capable of sorting and writing "1" and "0" is characterized by including the free layer with magnetization regions oriented to a hard-axis direction, of which the magnetization directions are not switching after the writing operation, in addition to including the structure of realizing normal toggle operation. In the magnetoresistive element 5 of the first exemplary embodiment, the regions of which the magnetization directions are not switched was realized in the end portions by using the synthetic ferrimagnet free layer 1 with a shape whose end portions are extended as a free layer. As stated above, it was confirmed by the LLG simulation that "1" and "0" can be sorted and written only by effects of the shape. The antiferromagnetic layer 20 of the first exemplary embodiment plays a role of further stabilizing end magnetizations and unifying the end magnetization directions. In the present exemplary embodiment, a ferromagnetic layer 70 can be used in place of the antiferromagnetic layer 20.

FIG. 12 is a cross-sectional view showing a structure in the vicinity of the memory cell of the MRAM in the second exemplary embodiment of the present invention. The magnetoresistive element 5 of the memory cell 10 includes the antiferromagnetic layer 4, the synthetic ferrimagnet pinned layer 3, the nonmagnetic layer (tunnel insulating layer) 2, the synthetic ferrimagnet free layer 1 and the ferromagnetic layer 70, where each of the layers is laminated in this order. The present invention has the ferromagnetic layer 70 instead of the antiferromagnetic layer 20, which differs from the first exemplary embodiment. The ferromagnetic layer 70 is provided on the both end portions of the ferromagnetic layer 11 in the E-axis direction. The ferromagnetic layer 70 has a magnetization direction pinned to the H-axis direction which is perpendicular to the E-axis direction. Therefore, portions directly below the ferromagnetic layers 70 in the ferromagnetic layer 11 have magnetization directions which are pinned antiparallel to the magnetization directions of the ferromagnetic layers 70.

Since other structure, operation and manufacturing method are similar to those of the first exemplary embodiment, explanation thereof will be omitted.

FIGS. 13A and 13B are schematic views showing structures in the vicinity of the memory cell of the MRAM in a second exemplary embodiment of the present invention. FIG. 13A is a top view in the vicinity of the memory cell, and FIG. 13B is a top view of the magnetoresistive element of the memory cell. A longitudinal direction (or long-axis direction) of the magnetoresistive element 5, which is the E-axis direction, is oriented to a direction tilted at about 45 degrees (θ) with respect to the write word line 26 and the bit line 27. It is considered that this makes the toggle operation easy. The magnetoresistive element 5 has a long axis oriented to the E axis, and ends of sides along the long axis have a shape expanded to the H-axis direction which is perpendicular to the E-axis direction. The ferromagnetic layers 70 are shaped so as to be in contact with only the expanded end regions of the synthetic ferrimagnet free layer 1 of the magnetoresistive element 5.

The magnetoresistive element 5 of the present exemplary embodiment causes the ferromagnetic layers 70 to be in touch with the synthetic ferrimagnet free layer 1, whereby eight types of magnetization stable states as shown in FIGS. 7A to 7H can be narrowed down to two types. The ferromagnetic layers 70 are laminated on the end regions of the ferromagnetic layer 11 in the synthetic ferrimagnet free layer 1. Then, in order to initialize end regions, a magnetic field which is large enough to switch the magnetization directions of the end portion is applied in the +H direction and then stopped to an original state. Owing to this application, the magnetization directions of the end regions of the ferromagnetic layer 11 whose magnetovolume is larger than that of the ferromagnetic layer 13 by the volume of the ferromagnetic layer 70 can be set to the +H direction. Switching of the magnetization directions at the end regions can be prevented by using an appropriate write magnetic field. As a result, the ferromagnetic layer 11 is in a stable state as shown in FIGS. 7A and 7B where the magnetization directions of the end regions are oriented to the +H direction and the magnetization direction in the vicinity of the center portion is oriented to one of the E-axis directions (i.e. one of +E direction and −E direction). The states of "0" and "1" can be distinguished by magnetization directions in the vicinity of the center portion.

As stated above, the second exemplary embodiment makes it possible to initialize end magnetization by using ferromagnetic materials (i.e. ferromagnetic layers 70) in place of the antiferromagnetic materials (i.e. antiferromagnetic layers 20) of the first exemplary embodiment.

Since the operations to read and to write the MRAM in the present exemplary embodiment are similar to those of the first exemplary embodiment, explanation thereof will be omitted.

The present invention makes it possible to obtain the magnetoresistive element and the magnetic random access memory in which "1" and "0" can be sorted and written without multiple writing. Then, owing to sorting and writing "1" and "0", it is unnecessary to read data at the time of the write operation as required in the conventional toggle MRAM, whereby the writing speed can be improved.

Third Exemplary Embodiment

The magnetic random access memory to which the magnetoresistive element is applied in a third exemplary embodiment of the present invention will be explained. Since a structure of the MRAM in a third exemplary embodiment of the present invention is similar to that of the first exemplary embodiment (as shown in FIG. 4), explanation of the structure will be omitted.

In the present exemplary embodiment, partially hardened regions of the ferromagnetic layer can be used in place of the antiferromagnetic layers 20 of the first exemplary embodiment.

Figure 14:
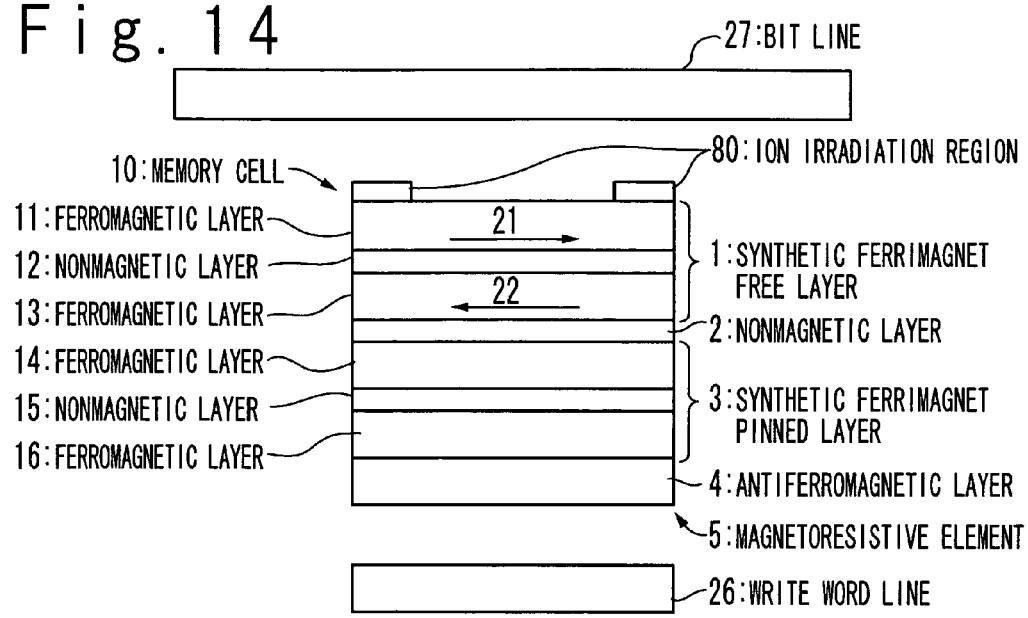
FIG. 14 is a cross-sectional view showing a structure in the vicinity of the memory cell of the MRAM in a third exemplary embodiment according to the present invention.

FIG. 14 is a cross-sectional view showing a structure in the vicinity of the memory cell of the MRAM in the third exemplary embodiment of the present invention. The magnetoresistive element 5 of the memory cell 10 includes the antiferromagnetic layer 4, the synthetic ferrimagnet pinned layer 3, the nonmagnetic layer (or tunnel insulating layer) 2, and the synthetic ferrimagnet free layer 1, having a structure in which each of the layers is laminated in this order. The present exemplary embodiment uses partially hardened regions 80 of the ferromagnetic layer 11 in place of the antiferromagnetic layers 20, which differs from the first exemplary embodiment. Both ends of the ferromagnetic layer 11 of the synthetic ferrimagnet free layer 1 are modified into the regions 80 by ion irradiation.

Since other structure, operation and manufacturing method are similar to those of the first exemplary embodiment, explanation thereof will be omitted.

Figure 15A:
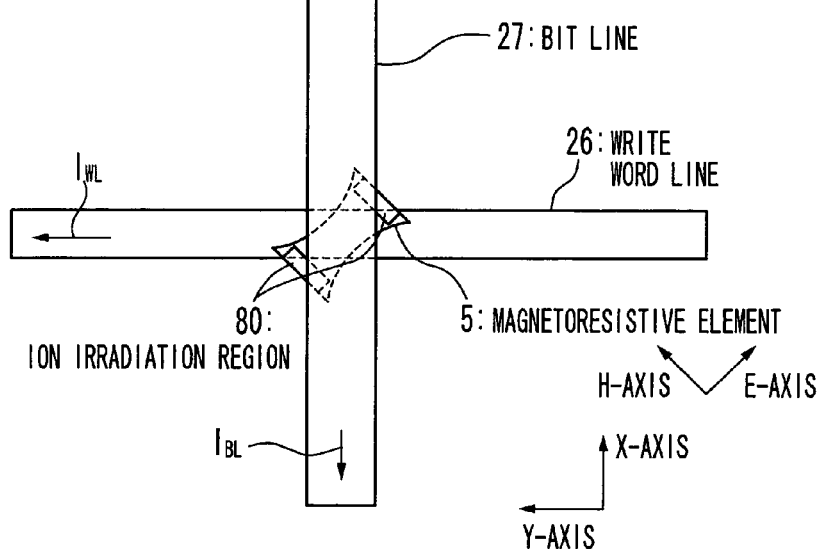
FIG. 15A is a schematic view showing a structure in the vicinity of the memory cell of the MRAM in the third exemplary embodiment according to the present invention.
Figure 15B:
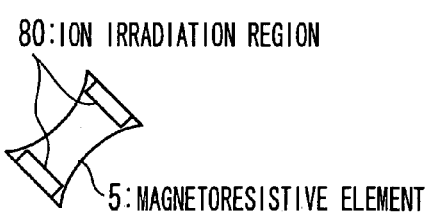
FIG. 15B is a schematic view showing a structure in the vicinity of the memory cell of the MRAM in the third exemplary embodiment according to the present invention.

FIGS. 15A and 15B are schematic views showing structures in the vicinity of the memory cell of the MRAM in a third exemplary embodiment of the present invention. FIG. 15A is a top view in the vicinity of the memory cell, and FIG. 15B is a top view of the magnetoresistive element of the memory cell. The long-axis direction of the magnetoresistive element 5, which is the E-axis direction, is oriented to a direction tilted at about 45 degrees (θ) with respect to the write word line 26 and the bit line 27. It is considered that this makes the toggle operation easy. The magnetoresistive element 5 has a long axis oriented to the E axis, and ends of sides along the long axis have a shape expanded to the H-direction which is perpendicular to the E-axis direction. The end regions 80 of the ferromagnetic layer 11 have anisotropy in the direction of a hard magnetization axis (or H axis) tilted from an easy magnetization axis (or E axis) in the center portion of the ferromagnetic layer 11 by ion irradiation.

In general, a magnetic modification in a magnetic layer can be brought by irradiating ions on the magnetic layer. For example, magnetic anisotropy and exchange coupling can be modified. Methods for local ion irradiation include a method using masks and a method using focus ion beams. Magnetic characteristics can be modified by irradiating ions such as, for example, Ga and Ar to modify the structure. In the present exemplary embodiment, ions are irradiated in only the end regions of the ferromagnetic layer 11 during application of a magnetic field in order to cause anisotropy to locally tilt to the H-axis direction, which makes it difficult to switch end magnetization directions during writing. Different magnetovolumes can also be provided in the top and bottom of the synthetic ferrimagnet free layer 1 by irradiating ions to reduce the end magnetization.

In the magnetoresistive element 5 of the present exemplary embodiment, the ferromagnetic layer 11 with end portions irradiated with ions is used to narrow down eight types of stable magnetization states as shown in FIGS. 7A to 7H to two types. The regions 80 are formed by ion irradiation at the end portions of the ferromagnetic layer 11 of the synthetic ferrimagnet free layer 1, which creates a difference in the magnetovolume of the end portions between the ferromagnetic layer 11 and the ferromagnetic layer 13. In order to initialize the end regions, a magnetic field which is large enough to switch the end regions is applied to the −H direction and then stopped to an original state. Therefore, the magnetization in the end region of the ferromagnetic layer 11 is reduced by a magnetovolume decreased by ion irradiation, whereby the magnetization in the end region of the ferromagnetic layer 13 is relatively made larger than that of the ferromagnetic layer 11. That is, the magnetization directions in the end regions of the ferromagnetic layer 13 can be set to the −H direction. The switching of the magnetization directions in the end regions can be prevented by using an appropriate write magnetic field. As a result, the ferromagnetic layer 11 exhibits a stable state as shown in FIGS. 7A and 7B, where the magnetization directions of the end portions of the ferromagnetic layer 11 are oriented to the +H direction and the magnetization direction in the vicinity of the center portion is oriented to one of the E-axis directions (i.e. +E direction and −E direction). The state of "0" and "1" can be distinguished by the magnetization direction in the vicinity of the center portion.

As stated above, the regions 80 irradiated with ions are used in the third exemplary embodiment in place of an antiferromagnetic material (i.e. antiferromagnetic layer 20) of the first exemplary embodiment, whereby the end magnetization can be initialized.

Since operations to read and to write the MRAM in the present exemplary embodiment is similar to that of the first exemplary embodiment, explanation thereof will be omitted.

The present invention makes it possible to obtain the magnetoresistive element and the magnetic random access memory in which "1" and "0" can be sorted and written without multiple writing. Then, owing to sorting and writing "1" and "0", it is unnecessary to read data at the time of the write operation as required in the conventional toggle MRAM, whereby a writing speed can be improved.

Fourth Exemplary Embodiment

The magnetic random access memory to which the magnetoresistive element is applied in a fourth embodiment according to the present invention will be explained. Since a structure of the MRAM in a fourth exemplary embodiment of the present invention is similar to that in the first exemplary embodiment (as shown in FIG. 4), explanation of the structure will be omitted.

In the present exemplary embodiment, the magnetoresistive element 5 without the expanded shape in the end portions can be used to replace for the shape of the magnetoresistive element 5 in the first exemplary embodiment.

Figure 16:
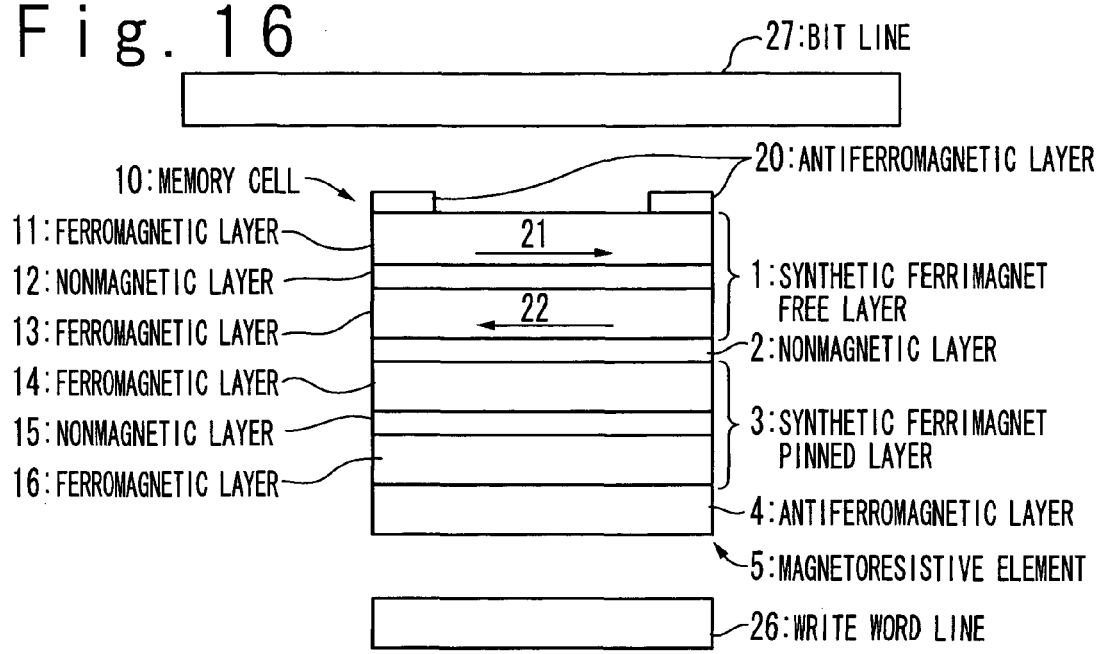
FIG. 16 is a cross-sectional view showing a structure in the vicinity of the memory cell of the MRAM in a fourth exemplary embodiment according to the present invention.

FIG. 16 is a cross-sectional view showing a structure in the vicinity of the memory cell of the MRAM in the fourth exemplary embodiment of the present invention. The magnetoresistive element 5 of the memory cell 10 includes the antiferromagnetic layer 4, the synthetic ferrimagnet pinned layer 3, the nonmagnetic layer (or tunnel insulating layer) 2, the synthetic ferrimagnet free layer 1 and the antiferromagnetic layers 20, where each of the layers is laminated in this order. The present exemplary embodiment differs from the first exemplary embodiment in the shape of the magnetoresistive element 5.

Since other structure, operation and manufacturing method are similar to those of the first exemplary embodiment, explanation thereof will be omitted.

Figure 17A:
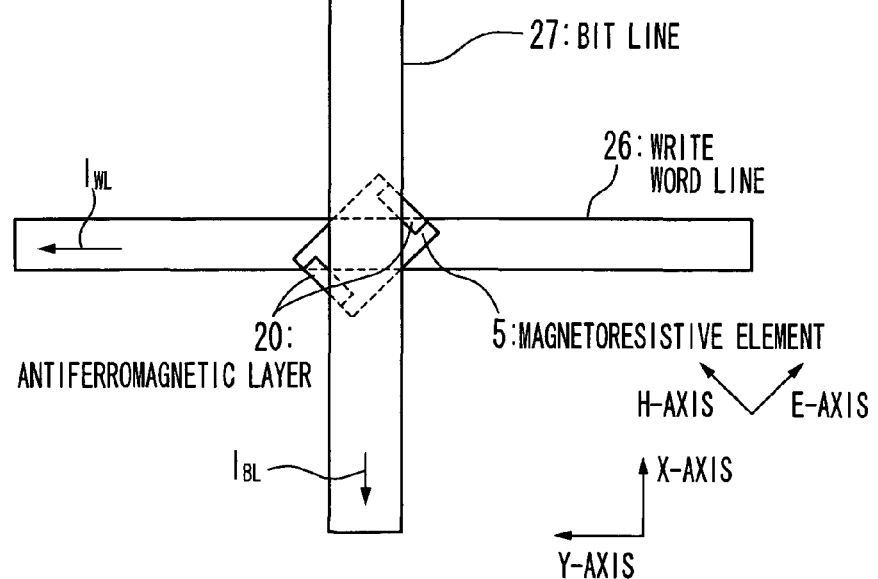
FIG. 17A is a schematic view showing a structure in the vicinity of the memory cell of the MRAM in the fourth exemplary embodiment according to the present invention.
Figure 17B:
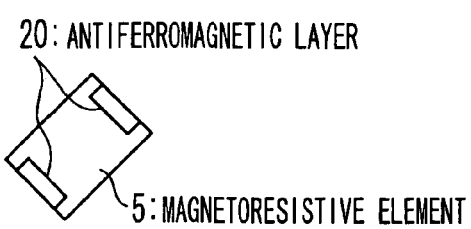
FIG. 17B is a schematic view showing a structure in the vicinity of the memory cell of the MRAM in the fourth exemplary embodiment according to the present invention.

FIGS. 17A and 17B are schematic views showing structures in the vicinity of the memory cell of the MRAM in the fourth exemplary embodiment of the present invention. FIG. 17A is a top view in the vicinity of the memory cell, and FIG. 17B is a top view of the magnetoresistive element of the memory cell. The long-axis direction of the magnetoresistive element 5, which is the E-axis direction, is oriented to a direction tilted at about 45 degrees (θ) with respect to the write word line 26 and the bit line 27. It is considered that this makes the toggle operation easy. The magnetoresistive element 5 has a rectangular shape with a long axis oriented to the E axis direction. End magnetization directions tend to tilt from the E-axis direction to the H-axis direction so as to reduce local magnetostatic energy, but the degree of the tilt in the end magnetization directions is smaller than that of the magnetoresistive element 5 with the extended end shape in the first exemplary embodiment. The antiferromagnetic layers 20 are formed so as to be in contact with only the end regions corresponding to both ends in a long axis of the synthetic ferrimagnet free layer 1 of the magnetoresistive element 5.

The magnetoresistive element 5 of the present exemplary embodiment causes the antiferromagnetic layers 20 to be in contact with the synthetic ferrimagnet free layer 1, whereby two types of stable states can be achieved. The antiferromagnetic layers 20 are laminated on the end regions of the ferromagnetic layer 11 of the synthetic ferrimagnet free layer 1, and the magnetization directions of the end regions in contact with the antiferromagnetic layer can be set to a desired direction in the H-axis direction. Switching of magnetization directions of the end regions can be prevented by using an appropriate write magnetic field. As a result, the ferromagnetic layer 11 exhibits a stable state such that the magnetization directions in the end regions are constantly oriented to a desired direction in the H-axis direction and the magnetization direction in the vicinity of the center portion is oriented to one of +E direction and −E direction in the E-axis direction. Therefore, The state of "0" and "1" can be distinguished by the magnetization directions in the vicinity of the center portion.

As stated above, the present exemplary embodiment employs the rectangular shape in place of the extended end shape in the first exemplary embodiment. Even in the rectangular shape, it is made possible to initialize the end magnetization by laminating the antiferromagnetic layers 20 on the end portions. It was then confirmed by the LLG simulation that "1" and "0" can be sorted and written by the magnetoresistive element 5 of the present exemplary embodiment.

The present invention makes it possible to obtain the magnetoresistive element and the magnetic random access memory in which "1" and "0" can be sorted and written without multiple writing. Then, owing to sorting and writing "1" and "0", it is unnecessary to read data at the time of the write operation as required in the conventional toggle MRAM, whereby a writing speed can be improved.

Figure 18A:
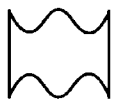
FIG. 18A is a schematic view showing an alternative shape in the planar structure of the magnetoresistive element.
Figure 18B:
FIG. 18B is a schematic view showing an alternative shape in the planar structure of the magnetoresistive element.

The magnetoresistive element 5 has a rectangular plane shape in the present exemplary embodiment, where as the first to third exemplary embodiments have a narrow center portion with expanded end portions. However, the present invention is not limited to these shapes. FIGS. 18A and 18B are schematic views showing alternative shapes in the plane structure of the magnetoresistive element 5. The magnetoresistive element 5 shown in FIG. 18A has a long axis oriented to the E-axis direction, where end portions of a side along this long axis have shapes expanded to the H-axis direction. It is also characterized by the center portion of the magnetoresistive element 5 which is further expanded to the H-axis direction. The expanded shape in the center portion of the magnetoresistive element 5 has effects to reduce a flop magnetic field, so that there are provided the magnetoresistive element and the magnetic random access memory in which data can be written with a low current. The magnetoresistive element 5 of FIG. 18B has a long axis oriented to the E-axis direction, and end portions of a side along the long axis have shapes expanded to a direction slightly tilted from the H-axis direction. It is further characterized by the end portions tilted in parallel from one another. The magnetoresistive element 5 of FIG. 18C has a long axis oriented to the E axis direction, and end portions of a side along this long axis have shapes expanded to a direction slightly tilted from the H-axis direction. It is further characterized by the end portions tilted mirror-symmetrically with respect to a plane which is disposed in the center portion there between and perpendicular to the E-axis direction. In both FIGS. 18B and 18C, the end magnetization directions are oriented to a direction tilted from the E-axis direction. However, end magnetization directions tend to be parallel in FIG. 18B, where as end magnetization directions tend to be antiparallel in FIG. 18C. Parallel directions are desirable to sort and write "1" and "0", which explains FIG. 18B is more desirable.

Figure 18C:
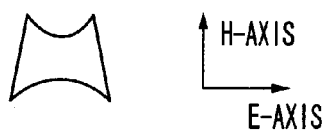
FIG. 18C is a schematic view showing an alternative shape in the planar structure of the magnetoresistive element.

It is also possible to obtain effects similar to those of the first to fourth exemplary embodiments by using the magnetoresistive element 5 having the plane shapes as shown in FIGS. 18A to 18C.

Fifth Exemplary Embodiment

The magnetic random access memory to which the magnetoresistive element is applied in a fifth exemplary embodiment of the present invention will be explained. Since the MRAM in the fifth exemplary embodiment of the present invention has a structure which is similar to that in the first exemplary embodiment (as shown in FIG. 4), explanation of the structure will be omitted.

In the present exemplary embodiment, in place of the magnetoresistive element 5 of the first exemplary embodiment, the magnetoresistive element 5 can be upside down with the smaller synthetic ferrimagnet pinned layer 3.

Figure 19:
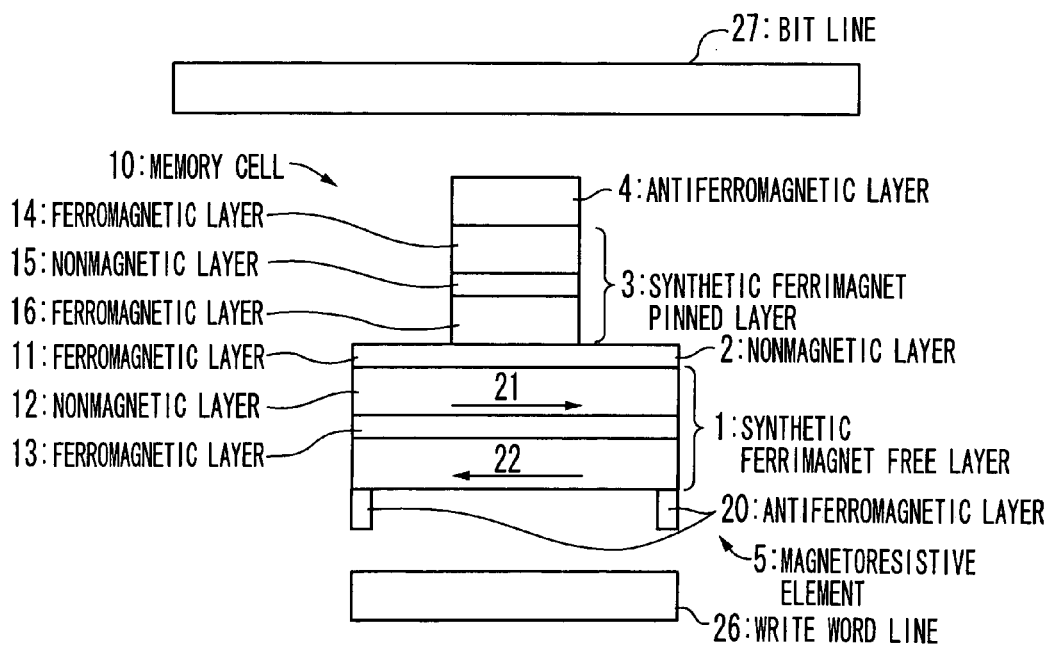
FIG. 19 is a cross-sectional view showing a structure in the vicinity of the memory cell of the MRAM in a fifth exemplary embodiment according to the present invention.

FIG. 19 is a cross-sectional view showing a structure in the vicinity of the memory cell of the MRAM in the fifth exemplary embodiment of the present invention. In this memory cell 10, an amount of a read signal increases, an amount of a write current decreases and a region in which "1" and "0" can be sorted and written is expanded. The magnetoresistive element 5 of the memory cell 10 includes the antiferromagnetic layers 20, the synthetic ferrimagnet free layer 1, the tunnel insulating layer 2, the synthetic ferrimagnet pinned layer 3 and the antiferromagnetic layer 4, where each of the layers is laminated in this order. The synthetic ferrimagnet free layer 1 has a synthetic ferrimagnet structure, including the ferromagnetic layer 11, the nonmagnetic layer 12 and the ferromagnetic layer 13. The synthetic ferrimagnet pinned layer 3 has a synthetic ferrimagnet structure, including the ferromagnetic layer 14, the nonmagnetic layer 15 and the ferromagnetic layer 16 which are laminated in this order. The synthetic ferrimagnet pinned layer 3 is provided on a central region of the synthetic ferrimagnet free layer 1 in the longitudinal direction via the nonmagnetic layer 2. The magnetoresistive element 5 is provided via an inter layer insulating film (not shown) between the write word line 26 and the bit line 27 which are crossed from one another in a substantially perpendicular state.

Figure 20A:
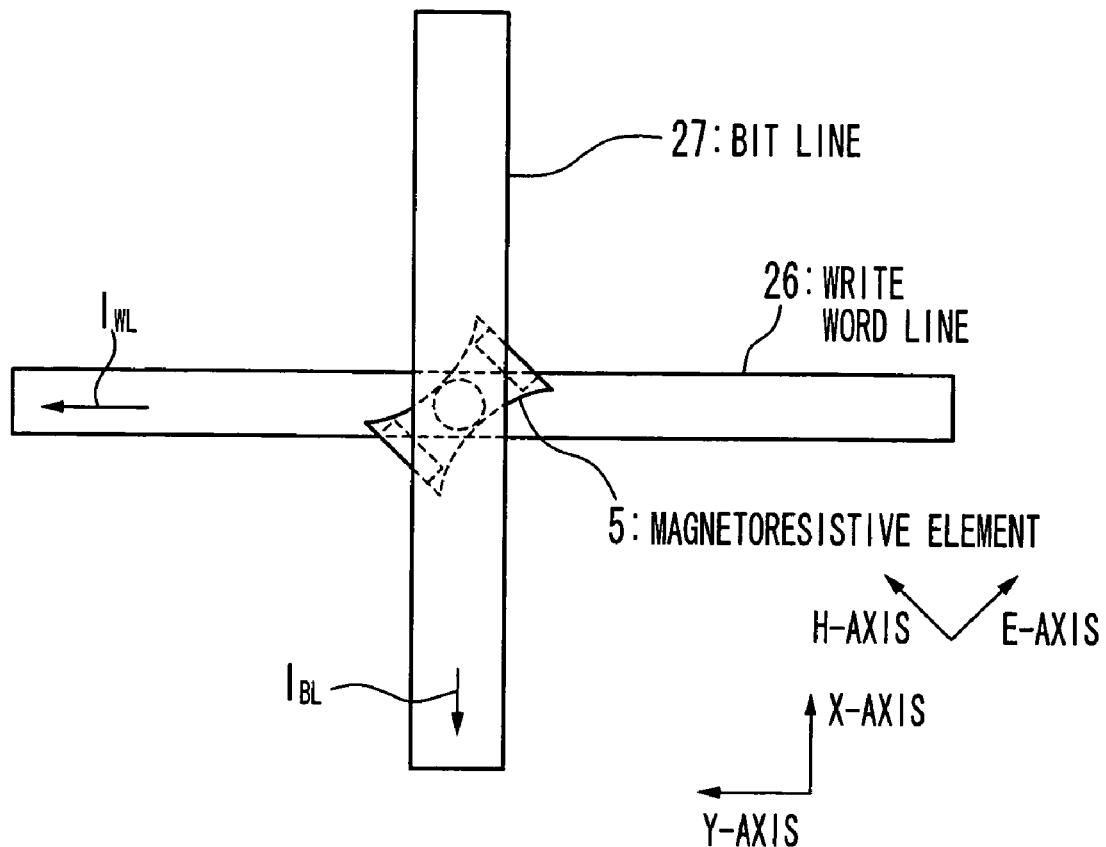
FIG. 20A is a schematic view showing a structure in the vicinity of the memory cell of the MRAM in the fifth exemplary embodiment according to the present invention.
Figure 20B:
FIG. 20B is a schematic view showing a structure in the vicinity of the memory cell of the MRAM in the fifth exemplary embodiment according to the present invention.

FIGS. 20A and 20B are schematic diagrams showing structures in the vicinity of the memory cell of the MRAM in the fifth exemplary embodiment of the present invention. FIG. 20A is a top view in the vicinity of the memory cell, and FIG. 20B is a top view of the magnetoresistive element of the memory cell. A long-axis direction of the synthetic ferrimagnet free layer 1 and the nonmagnetic layer 2 of the magnetoresistive element 5, which is the E-axis direction, is oriented to a direction tilted at about 45 degrees (e) with respect to the write word line 26 and the bit line 27. It is considered that this makes the toggle operation easy. The synthetic ferrimagnet free layer 1 and the nonmagnetic layer 2 of the magnetoresistive element 5 have the long axis oriented to the E axis direction, and end portions of a side along this long axis have shapes expanded to the H-axis direction. The antiferromagnetic layers 20 are formed to be in contact with only the expanded end regions of the synthetic ferrimagnet free layer 1.

The synthetic ferrimagnet pinned layer 3 is formed to be in contact with only a central region of the synthetic ferrimagnet free layer 1. The shape is exemplified by elliptical and rectangular shapes having a long axis parallel to the E-axis direction. Such shapes are used to allow a read current to flow in the central region of the magnetoresistive element 5. It is therefore made possible to increase the amount of the read signal. As a result, resistance depending on a relative angle made between magnetization of the ferromagnetic layer 14 and magnetization of the ferromagnetic layer 13 which face via the nonmagnetic layer 2 can be obtained more accurately. It is mainly because of following reasons. The ferromagnetic layer 13 has a magnetization direction oriented to the E-axis direction in the center portion and magnetization directions oriented to the H-axis direction at the end portions, as opposed to the ferromagnetic layer 14 of which a magnetization direction is oriented to the E-axis direction. It is preferable that the ferromagnetic layer 14 is in contact with only the magnetization in the center portion of the ferromagnetic layer 13 so as to have large variations in the relative angle between "0" and "1". The increased relative angle in the magnetization directions results in the increased amount of the read signal, enhancing a reading speed and improving resistance property to elements with poor resistance.

The write word line 26 and the bit line 27 preferably have center portions corresponding to the center portion of the magnetoresistive element 5, and their widths are preferably smaller than that of the magnetoresistive element 5. It is because the strong magnetic field is applied to the center portion of the magnetoresistive element 5 while preventing application of the strong magnetic field to the end portions thereof, which therefore prevents switching of the end magnetization directions of the synthetic ferrimagnet free layer 1 and expands a region to sort and write "1" and "0". Furthermore, the wiring with a narrowed width provides effects including enhanced current—magnetic field conversion efficiency and a reduced write current.

Since other structure, operation (including operations to read and to write MRAM) and manufacturing method are similar to those of the first exemplary embodiment, explanation thereof will be omitted.

The present invention makes it possible to obtain the magnetoresistive element and the magnetic random access memory in which "1" and "0" can be sorted and written without multiple writing. Then, owing to sorting and writing "1" and "0", it is unnecessary to read data at the time of the write operation as required in the conventional toggle MRAM, whereby the writing speed can be improved.

The above first to fifth exemplary embodiments can be used in appropriate combinations as long as no technical contradiction is observed. In this case, effects similar to the aforementioned effects can be obtained.

The present invention is not limited to the above first to fifth exemplary embodiments, and it is obvious that each of the exemplary embodiments can be appropriately changed within the scope of technical ideas of the present invention.

According to the present invention, it is made possible to obtain the magnetoresistive element and the magnetic random access memory in which "1" and "0" can be sorted and written while preventing multiple writing. Then, the writing speed can be improved because "1" and "0" can be sorted and written.

The invention claimed is:

1. A magnetoresistive element comprising:
   a free layer;
   a pinned layer;
   a nonmagnetic layer interposed between said free layer and said pinned layer; and
   two magnetic layers arranged on an opposite side of said free layer to said nonmagnetic layer,
   wherein said free layer includes:
   a first magnetic layer, a second magnetic layer, and
a first nonmagnetic layer interposed between said first magnetic layer and said second magnetic layer,
wherein magnetization of said first magnetic layer and magnetization of said second magnetic layer are antiferromagnetically coupled,
wherein one of said two magnetic layers is in contact with one end of said free layer in a long-axis direction, and the other of said two magnetic layers is in contact with the other end of said free layer in said long-axis direction,
wherein a substantially right angle is made between a magnetization direction of a center portion of said free layer and magnetization directions of two magnetic layers when external magnetic field is not applied to said magnetoresistive element, and
wherein a magnetovolume of said first magnetic layer is substantially equal to that of said second magnetic layer.

2. The magnetoresistive element according to claim 1, wherein said two magnetic layers include one of ferromagnetic material and antiferromagnetic material.

3. The magnetoresistive element according to claim 1, wherein a planar structure of said free layer includes a side along said long axis direction having a portion expanded to a direction different from said long axis direction.

4. The magnetoresistive element according to claim 1, wherein a direction of each of magnetizations of both end portions of said free layer is substantially perpendicular to a direction of a straight line between said both side portions.

5. The magnetoresistive element according to claim 1, wherein a direction of a magnetization of said pinned layer is substantially parallel to said long-axis direction.

6. A magnetic random access memory comprising:
a plurality of first wirings extended in a first direction;
a plurality of second wirings extended in a second direction substantially perpendicular to said first direction; and
a plurality of memory cells provided at corresponding respective positions where said plurality of said first wirings and said plurality of said second wirings are crossed,
wherein each of said plurality of said memory cells includes a magnetoresistive element,
wherein said magnetoresistive element includes:
a free layer,
a pinned layer,
a nonmagnetic layer interposed between said free layer and said pinned layer, and
two magnetic layers arranged on an opposite side of said free layer to said nonmagnetic layer,
wherein said free layer includes:
a first magnetic layer,
a second magnetic layer, and
a first nonmagnetic layer interposed between said first magnetic layer and said second magnetic layer,
wherein magnetization of said first magnetic layer and magnetization of said second magnetic layer are antiferromagnetically coupled,
wherein one of said two magnetic layers is in contact with one end of said free layer in a long-axis direction, and the other of said two magnetic layers is in contact with the other end of said free layer in said long-axis direction,
wherein said magnetoresistive element has said long-axis direction different from said first and second directions,
wherein a susbstantially right angle is made between a magnetization direction of a center portion of said free layer and magnetization directions of two magnetic layers when external magnetic field is not applied to said electroresistive element, and
wherein a magnetovolume of said first magnetic layer is substantially equal to that of said second magnetic layer.

7. A magnetic random access memory, comprising:
a plurality of first wirings extended in a first direction;
a plurality of second wirings extended in a second direction substantially perpendicular to said first direction; and
a plurality of memory cells provided at corresponding respective positions where said plurality of said first wirings and said plurality of second wirings are crossed,
wherein each of said plurality of said memory cells includes a magnetoresistive element,
wherein said magnetoresistive element includes:
a free layer;
a pinned layer;
a nonmagnetic layer interposed between said free layer and said pinned layer; and
two magnetic layers arranged adjacent to said free layer on an opposite side to said pinned layer,
wherein said free layer includes:
a first magnetic layer;
a second magnetic layer; and
a first nonmagnetic layer interposed between said first magnetic layer and said second magnetic layer,
wherein magnetization of said first magnetic layer and magnetization of said second magnetic layer are antiferromagnetically coupled,
wherein one of said two magnetic layers is in contact with one end of said free layer in a long-axis direction, and the other of said two magnetic layers is in contact with the other end of said free layer in said long-axis direction,
wherein said magnetoresistive element has said long-axis direction different from said first and second directions, and
wherein, to a selected cell serving as a memory cell corresponding to a selected first wiring, which is selected from said plurality of said first wirings, and a selected second wiring, which is selected from said plurality of said second wirings, a write operation is executed such that a first write current is supplied to a first current wiring which is selected from said selected first wiring and said selected second wiring based on data to be written, then, a second write current is supplied to a second current wiring which is said remaining one of said selected first wiring and said selected second wiring, thereafter, said first write current is discontinued, and then, said second write current is discontinued.

8. A method of writing a magnetic random access memory, comprising:
providing said magnetic random access memory, wherein said magnetic random access memory includes:
a plurality of first wirings extended in a first direction,
a plurality of second wirings extended in a second direction substantially perpendicular to said first direction, and
a plurality of memory cells provided at corresponding respective positions where said plurality of said first wirings and said plurality of said second wirings are crossed,
wherein each of said plurality of said memory cells includes a magnetoresistive element,
wherein said magnetoresistive element includes:
a free layer,
a pinned layer,
a nonmagnetic layer interposed between said free layer and said pinned layer, and
two magnetic layers arranged adjacent to said free layer on said opposite side to said pinned layer, wherein said free layer includes:
a first magnetic layer,
a second magnetic layer, and
a first nonmagnetic layer interposed between said first magnetic layer and said second magnetic layer,
wherein magnetization of said first magnetic layer and magnetization of said second magnetic layer are antiferromagnetically coupled,
wherein one of said two magnetic layers is in contact with one end of said free layer in said long axis direction, and the other of said two magnetic layers is in contact with the other end of said free layer in said long-axis direction, and
wherein said long-axis direction differs from said first and second directions,
said method of writing said magnetic random access memory comprising:
selecting a selected first wiring from said plurality of said first wirings and selecting a selected second wiring from said plurality of said second wirings;
supplying a first write current to a first current wiring which is selected from said selected first wiring and said selected second wiring based on data to be written;
supplying a second write current to a second current wiring which is said remaining one of said selected first wiring and said selected second wiring, after supplying said first write current;
discontinuing said first write current after supplying said second write current; and
discontinuing said second write current after discontinuing said first write current.

9. The method of writing the magnetic random access memory according to claim 8, wherein a substantially right angle is made between a magnetization direction of a center portion of said free layer and magnetization directions of said two magnetic layers.

10. The method of writing the magnetic random access memory according to claim 9, wherein said two magnetic layers include one of ferromagnetic material and antiferromagnetic material.

11. The method of writing the magnetic random access memory according to claim 9, wherein said two magnetic layers are included in said free layer.

12. The method of writing the magnetic random access memory according to claim 8, a magnetovolume of said first magnetic layer is substantially equal to that of said second magnetic layer.

13. The method of writing the magnetic random access memory according to claim 8, a planar structure of said free layer includes a side along said long axis direction having a portion expanded to a direction different from said long axis direction.

14. A magnetic random access memory, comprising:
a plurality of first wirings extended in a first direction;
a plurality of second wirings extended in a second direction substantially perpendicular to said first direction; and
a plurality of memory cells provided at corresponding respective positions where said plurality of said first wirings and said plurality of second wirings are crossed,
wherein each of said plurality of said memory cells includes a magnetoresistive element,
wherein said magnetoresistive element includes:
a free layer;
a pinned layer;
a nonmagnetic layer interposed between said free layer and said pinned layer; and
two magnetic layers arranged adjacent to said free layer on an opposite side to said pinned layer,
wherein said free layer includes:
a first magnetic layer;
a second magnetic layer; and
a first nonmagnetic layer interposed between said first magnetic layer and said second magnetic layer,
wherein magnetization of said first magnetic layer and magnetization of said second magnetic layer are antiferromagnetically coupled,
wherein one of said two magnetic layers is in contact with one end of said free layer in a long-axis direction, and the other of said two magnetic layers is in contact with the other end of said free layer in said long-axis direction,
wherein said magnetoresistive element has said long-axis direction different from said first and second directions, and
wherein, in said magnetoresistive element, a substantially right angle is made between a magnetization direction of a center portion of said free layer and magnetization directions of two magnetic layers.

15. The magnetic random access memory according to claim 14, wherein in said magnetoresistive element, said two magnetic layers include one of ferromagnetic material and antiferromagnetic material.

16. The magnetic random access memory according to claim 14, wherein in said magnetoresistive element, said two magnetic layers are included in said free layer.

17. A magnetic random access memory, comprising:
a plurality of first wirings extended in a first direction;
a plurality of second wirings extended in a second direction substantially perpendicular to said first direction; and
a plurality of memory cells provided at corresponding respective positions where said plurality of said first wirings and said plurality of second wirings are crossed,
wherein each of said plurality of said memory cells includes a magnetoresistive element,
wherein said magnetoresistive element includes:
a free layer;
a pinned layer;
a nonmagnetic layer interposed between said free layer and said pinned layer; and
two magnetic layers arranged adjacent to said free layer on an opposite side to said pinned layer,
wherein said free layer includes:
a first magnetic layer;
a second magnetic layer; and
a first nonmagnetic layer interposed between said first magnetic layer and said second magnetic layer,
wherein magnetization of said first magnetic layer and magnetization of said second magnetic layer are antiferromagnetically coupled,
wherein one of said two magnetic layers is in contact with one end of said free layer in a long-axis direction, and the other of said two magnetic layers is in contact with the other end of said free layer in said long-axis direction,
wherein said magnetoresistive element has said long-axis direction different from said first and second directions, and
wherein, in said magnetoresistive element, a magnetovolume of said first magnetic layer is substantially equal to that of said second magnetic layer.

18. A magnetic random access memory, comprising:
a plurality of first wirings extended in a first direction;
a plurality of second wirings extended in a second direction substantially perpendicular to said first direction; and a plurality of memory cells provided at corresponding respective positions where said plurality of said first wirings and said plurality of second wirings are crossed, wherein each of said plurality of said memory cells includes a magnetoresistive element, wherein said magnetoresistive element includes:
- a free layer;
- a pinned layer;
- a nonmagnetic layer interposed between said free layer and said pinned layer; and
- two magnetic layers arranged adjacent to said free layer on an opposite side to said pinned layer, wherein said free layer includes:
- a first magnetic layer;
- a second magnetic layer; and
- a first nonmagnetic layer interposed between said first magnetic layer and said second magnetic layer, wherein magnetization of said first magnetic layer and magnetization of said second magnetic layer are antiferromagnetically coupled, wherein one of said two magnetic layers is in contact with one end of said free layer in a long-axis direction, and the other of said two magnetic layers is in contact with the other end of said free layer in said long-axis direction, wherein said magnetoresistive element has said long-axis direction different from said first and second directions, and wherein, in said magnetoresistive element, a planar structure of said free layer includes a side along said long axis direction having a portion expanded to a direction different from said long axis direction.

* * * * *